United States Patent
Jo et al.

(10) Patent No.: US 9,450,140 B2
(45) Date of Patent: Sep. 20, 2016

(54) THIN FILM DEPOSITION APPARATUS AND METHOD OF MANUFACTURING ORGANIC LIGHT-EMITTING DISPLAY APPARATUS USING THE SAME

(75) Inventors: Chang-Mog Jo, Yongin (KR);
Jong-Heon Kim, Yongin (KR);
Yong-Sup Choi, Yongin (KR);
Sang-Soo Kim, Yongin (KR);
Hee-Cheol Kang, Yongin (KR);
Young-Mook Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 750 days.

(21) Appl. No.: 12/869,830

(22) Filed: Aug. 27, 2010

(65) Prior Publication Data

US 2011/0052791 A1    Mar. 3, 2011

(30) Foreign Application Priority Data

Aug. 27, 2009  (KR) .................. 10-2009-0079765
Feb. 8, 2010   (KR) .................. 10-2010-0011480

(51) Int. Cl.
*B05D 5/06*     (2006.01)
*C23C 16/00*    (2006.01)
(Continued)

(52) U.S. Cl.
CPC ........... *H01L 33/005* (2013.01); *C23C 14/042* (2013.01); *C23C 14/12* (2013.01);
(Continued)

(58) Field of Classification Search
USPC ......... 427/66, 69, 255.6, 282; 118/720, 729; 438/29, 35
See application file for complete search history.

(56) References Cited

U.S. PATENT DOCUMENTS 4,416,217 A    11/1983  Nakamura et al.
4,468,648 A     8/1984  Uchikune
(Continued)

FOREIGN PATENT DOCUMENTS

CN    1476279 A    2/2004
CN    1489419 A    4/2004
(Continued)

OTHER PUBLICATIONS

Korean Patent Abstracts, Publication No. 10-0151312 B1, dated Jun. 18, 1998, corresponding to Korean Publication 1997-0008709 listed above.

(Continued)

*Primary Examiner* — James Lin
(74) *Attorney, Agent, or Firm* — Lewis Roca Rothgerber Christie LLP

(57) ABSTRACT

A thin film deposition apparatus used to manufacture large substrates on a mass scale and that allows high-definition patterning, and a method of manufacturing an organic light-emitting display apparatus using the same, the apparatus includes a loading unit fixing a substrate onto an electrostatic chuck; a deposition unit including a chamber maintained in a vacuum state and a thin film deposition assembly disposed in the chamber, separated from the substrate by a predetermined distance, to deposit a thin film on the substrate fixed on the electrostatic chuck; an unloading unit separating the substrate on which a deposition process is completed, from the electrostatic chuck; a first circulation unit sequentially moving the electrostatic chuck on which the substrate is fixed, to the loading unit, the deposition unit, and the unloading unit; and a second circulation unit returning the electrostatic chuck separated from the substrate to the loading unit from the unloading unit, wherein the first circulation unit passes through the chamber when passing through the deposition unit.

9 Claims, 15 Drawing Sheets

(51) Int. Cl.
*B05D 1/32* (2006.01)
*H01L 21/00* (2006.01)
*H01L 33/00* (2010.01)
*C23C 14/04* (2006.01)
*C23C 14/12* (2006.01)
*C23C 14/24* (2006.01)
*C23C 14/56* (2006.01)
*H01L 21/67* (2006.01)
*H01L 21/683* (2006.01)
*H01L 51/00* (2006.01)
*H01L 51/56* (2006.01)
*H01L 27/32* (2006.01)

(52) U.S. Cl.
CPC .......... *C23C 14/243* (2013.01); *C23C 14/246* (2013.01); *C23C 14/568* (2013.01); *H01L 21/67173* (2013.01); *H01L 21/67225* (2013.01); *H01L 21/67236* (2013.01); *H01L 21/6831* (2013.01); *H01L 51/001* (2013.01); *H01L 51/0011* (2013.01); *H01L 51/56* (2013.01); *H01L 27/3211* (2013.01)
USPC ............ 427/66; 427/69; 427/255.6; 427/282; 118/720; 118/729; 438/29; 438/35

(56) References Cited

U.S. PATENT DOCUMENTS

| | | | |
|---|---|---|---|
| 4,687,939 A | 8/1987 | Miyauchi et al. | |
| 4,792,378 A | 12/1988 | Rose et al. | |
| 4,901,667 A | 2/1990 | Suzuki et al. | |
| 5,454,847 A | 10/1995 | Jacoboni et al. | |
| 5,460,654 A | 10/1995 | Kikkawa et al. | |
| 5,487,609 A | 1/1996 | Asada | |
| 5,641,054 A | 6/1997 | Mori et al. | |
| 5,742,129 A | 4/1998 | Nagayama et al. | |
| 5,909,995 A | 6/1999 | Wolf et al. | |
| 6,091,195 A | 7/2000 | Forrest et al. | |
| 6,099,649 A | 8/2000 | Schmitt et al. | |
| 6,222,198 B1 | 4/2001 | Brown | |
| 6,274,198 B1 | 8/2001 | Dautartas | |
| 6,280,821 B1 | 8/2001 | Kadunce et al. | |
| 6,371,451 B1 | 4/2002 | Choi | |
| 6,417,034 B2 | 7/2002 | Kitazume et al. | |
| 6,443,597 B1 | 9/2002 | Natori | |
| 6,483,690 B1 | 11/2002 | Nakajima et al. | |
| 6,541,130 B2 | 4/2003 | Fukuda | |
| 6,554,969 B1 | 4/2003 | Chong | |
| 6,579,422 B1 | 6/2003 | Kakinuma | |
| 6,589,673 B1 | 7/2003 | Kido et al. | |
| 6,650,023 B2 | 11/2003 | Kim | |
| 6,699,324 B1 | 3/2004 | Berdin et al. | |
| 6,749,906 B2 | 6/2004 | Van Slyke | |
| 6,776,847 B2 | 8/2004 | Yamazaki et al. | |
| 6,837,939 B1 | 1/2005 | Klug et al. | |
| 6,878,209 B2 | 4/2005 | Himeshima et al. | |
| 6,946,783 B2 | 9/2005 | Kim | |
| 6,995,035 B2 | 2/2006 | Cok et al. | |
| 7,006,202 B2 | 2/2006 | Byun et al. | |
| RE39,024 E | 3/2006 | Takahashi | |
| 7,078,070 B2 | 7/2006 | Peng | |
| 7,199,520 B2 | 4/2007 | Fujii et al. | |
| 7,282,855 B2 | 10/2007 | Park et al. | |
| 7,322,248 B1 | 1/2008 | Long | |
| 7,495,389 B2 | 2/2009 | Noguchi et al. | |
| 7,601,439 B2 | 10/2009 | Chun et al. | |
| 7,776,457 B2 | 8/2010 | Lee et al. | |
| 7,872,256 B2 | 1/2011 | Sung et al. | |
| 7,910,386 B2 | 3/2011 | Shiang et al. | |
| 7,964,037 B2 | 6/2011 | Fukuda et al. | |
| 8,022,448 B1 | 9/2011 | Luu et al. | |
| 8,128,753 B2 | 3/2012 | Bulovic et al. | |
| 8,137,466 B2 | 3/2012 | Kang et al. | |
| 8,188,476 B2 | 5/2012 | Takagi et al. | |
| 8,192,546 B2 | 6/2012 | Kim et al. | |
| 8,193,011 B2 | 6/2012 | Kang et al. | |
| 8,673,077 B2 | 3/2014 | Sonoda et al. | |
| 8,900,976 B2 | 12/2014 | Jin et al. | |
| 2001/0004186 A1 | 6/2001 | Song et al. | |
| 2001/0006827 A1 | 7/2001 | Yamazaki et al. | |
| 2001/0019807 A1 | 9/2001 | Yamada et al. | |
| 2001/0026638 A1 | 10/2001 | Sangu et al. | |
| 2001/0034175 A1 | 10/2001 | Miyazaki et al. | |
| 2002/0011785 A1 | 1/2002 | Tang et al. | |
| 2002/0017245 A1 | 2/2002 | Tsubaki et al. | |
| 2002/0033136 A1 | 3/2002 | Savage et al. | |
| 2002/0036759 A1 | 3/2002 | Ise et al. | |
| 2002/0050061 A1 | 5/2002 | Komyoji et al. | |
| 2002/0076847 A1 | 6/2002 | Yamada et al. | |
| 2002/0168577 A1 | 11/2002 | Yoon | |
| 2002/0179013 A1 | 12/2002 | Kido et al. | |
| 2002/0187253 A1 | 12/2002 | Marcus et al. | |
| 2002/0194727 A1 | 12/2002 | Cho et al. | |
| 2002/0197393 A1 | 12/2002 | Kuwabara | |
| 2003/0021886 A1 | 1/2003 | Baele | |
| 2003/0101932 A1 | 6/2003 | Kang | |
| 2003/0101937 A1 | 6/2003 | Van Slyke et al. | |
| 2003/0117602 A1 | 6/2003 | Kobayashi et al. | |
| 2003/0118950 A1 | 6/2003 | Chao et al. | |
| 2003/0124764 A1 | 7/2003 | Yamazaki et al. | |
| 2003/0151637 A1 | 8/2003 | Nakamura et al. | |
| 2003/0164934 A1 | 9/2003 | Nishi et al. | |
| 2003/0168013 A1 | 9/2003 | Freeman et al. | |
| 2003/0173896 A1 | 9/2003 | Grushin et al. | |
| 2003/0221614 A1 | 12/2003 | Kang et al. | |
| 2003/0221620 A1 | 12/2003 | Yamazaki | |
| 2003/0232563 A1 | 12/2003 | Kamiyama et al. | |
| 2004/0016907 A1 | 1/2004 | Shi | |
| 2004/0028349 A1 | 2/2004 | Nagasaka et al. | |
| 2004/0029028 A1 | 2/2004 | Shimizu | |
| 2004/0056244 A1 | 3/2004 | Marcus et al. | |
| 2004/0062856 A1 | 4/2004 | Marcus et al. | |
| 2004/0086639 A1 | 5/2004 | Grantham et al. | |
| 2004/0096771 A1 | 5/2004 | Kashiwagi et al. | |
| 2004/0115338 A1 | 6/2004 | Yoneda | |
| 2004/0115342 A1 | 6/2004 | Shigemura | |
| 2004/0123804 A1* | 7/2004 | Yamazaki et al. ..... | 118/723 VE |
| 2004/0127066 A1 | 7/2004 | Jung | |
| 2004/0134428 A1 | 7/2004 | Sasaki et al. | |
| 2004/0142108 A1 | 7/2004 | Atobe et al. | |
| 2004/0144321 A1 | 7/2004 | Grace et al. | |
| 2004/0157167 A1 | 8/2004 | Morii | |
| 2004/0183435 A1 | 9/2004 | Ohshita | |
| 2004/0194702 A1 | 10/2004 | Sasaki et al. | |
| 2004/0195530 A1 | 10/2004 | Kwak et al. | |
| 2004/0216673 A1 | 11/2004 | Sakata et al. | |
| 2004/0237895 A1 | 12/2004 | Carpenter et al. | |
| 2004/0255857 A1 | 12/2004 | Chow et al. | |
| 2004/0263547 A1 | 12/2004 | Sugahara | |
| 2004/0263771 A1 | 12/2004 | Jeong et al. | |
| 2005/0001546 A1 | 1/2005 | Yamaguchi | |
| 2005/0016461 A1 | 1/2005 | Klug et al. | |
| 2005/0031836 A1 | 2/2005 | Hirai | |
| 2005/0037136 A1 | 2/2005 | Yamamoto | |
| 2005/0039684 A1 | 2/2005 | Yi et al. | |
| 2005/0072359 A1 | 4/2005 | Kim | |
| 2005/0072361 A1 | 4/2005 | Yang et al. | |
| 2005/0079418 A1 | 4/2005 | Kelley et al. | |
| 2005/0110400 A1 | 5/2005 | Nakamura | |
| 2005/0118788 A1 | 6/2005 | Kuwahara et al. | |
| 2005/0129489 A1 | 6/2005 | Quan et al. | |
| 2005/0153472 A1 | 7/2005 | Yotsuya | |
| 2005/0166842 A1 | 8/2005 | Sakamoto | |
| 2005/0166844 A1 | 8/2005 | Gralenski | |
| 2005/0183670 A1 | 8/2005 | Grantham et al. | |
| 2005/0186330 A1 | 8/2005 | Kim et al. | |
| 2005/0213021 A1 | 9/2005 | Myoung | |
| 2005/0217584 A1 | 10/2005 | Abiko et al. | |
| 2005/0229848 A1 | 10/2005 | Shinriki et al. | |
| 2005/0244580 A1 | 11/2005 | Cok et al. | |
| 2005/0263074 A1 | 12/2005 | Masuda et al. | |
| 2005/0280356 A1 | 12/2005 | Murayama et al. | |
| 2006/0011136 A1 | 1/2006 | Yamazaki et al. | |

(56) References Cited

U.S. PATENT DOCUMENTS

| | | |
|---|---|---|
| 2006/0012280 A1 | 1/2006 | Kang et al. |
| 2006/0012771 A1 | 1/2006 | Jeong |
| 2006/0022590 A1 | 2/2006 | Aziz et al. |
| 2006/0040132 A1 | 2/2006 | Liao et al. |
| 2006/0045958 A1 | 3/2006 | Abiko et al. |
| 2006/0066231 A1 | 3/2006 | Nishikawa et al. |
| 2006/0090705 A1 | 5/2006 | Kim |
| 2006/0102078 A1* | 5/2006 | Fairbairn et al. ............. 118/719 |
| 2006/0103289 A1 | 5/2006 | Kim et al. |
| 2006/0110544 A1 | 5/2006 | Kim et al. |
| 2006/0113907 A1 | 6/2006 | Im et al. |
| 2006/0115585 A1 | 6/2006 | Bulovic et al. |
| 2006/0130766 A1 | 6/2006 | Kim et al. |
| 2006/0144325 A1 | 7/2006 | Jung et al. |
| 2006/0150910 A1 | 7/2006 | Han et al. |
| 2006/0152641 A1 | 7/2006 | Brody |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0255722 A1 | 11/2006 | Imanishi |
| 2006/0267294 A1 | 11/2006 | Busse et al. |
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigan et al. |
| 2007/0009552 A1 | 1/2007 | Whitehead et al. |
| 2007/0009652 A1* | 1/2007 | Manz et al. .................. 427/58 |
| 2007/0015430 A1 | 1/2007 | Nishio et al. |
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0054051 A1 | 3/2007 | Arai et al. |
| 2007/0075955 A1 | 4/2007 | Jung et al. |
| 2007/0077358 A1 | 4/2007 | Jeong et al. |
| 2007/0137568 A1 | 6/2007 | Schreiber |
| 2007/0148337 A1 | 6/2007 | Nichols et al. |
| 2007/0148348 A1 | 6/2007 | Huh et al. |
| 2007/0157879 A1 | 7/2007 | Yotsuya |
| 2007/0158471 A1 | 7/2007 | Park et al. |
| 2007/0163497 A1 | 7/2007 | Grace et al. |
| 2007/0178708 A1 | 8/2007 | Ukigaya |
| 2007/0190235 A1 | 8/2007 | Yamazaki et al. |
| 2007/0195844 A1 | 8/2007 | Ma et al. |
| 2007/0231460 A1 | 10/2007 | Ukigaya |
| 2007/0235157 A1 | 10/2007 | Bunker et al. |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0029368 A1 | 2/2008 | Komori |
| 2008/0038935 A1 | 2/2008 | Baude et al. |
| 2008/0057183 A1 | 3/2008 | Spindler et al. |
| 2008/0100204 A1 | 5/2008 | Kim |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0202421 A1 | 8/2008 | Allen et al. |
| 2008/0216741 A1 | 9/2008 | Ling et al. |
| 2008/0238294 A1 | 10/2008 | Xu et al. |
| 2008/0251785 A1 | 10/2008 | Noh et al. |
| 2008/0286461 A1 | 11/2008 | Noguchi et al. |
| 2008/0290791 A1 | 11/2008 | Lee et al. |
| 2008/0298947 A1 | 12/2008 | Yeo et al. |
| 2008/0305246 A1 | 12/2008 | Choi et al. |
| 2008/0309718 A1 | 12/2008 | Oya et al. |
| 2009/0001882 A1 | 1/2009 | Park et al. |
| 2009/0002659 A1 | 1/2009 | Hiyama |
| 2009/0014412 A1 | 1/2009 | Nozawa et al. |
| 2009/0017192 A1 | 1/2009 | Matsuura |
| 2009/0027767 A1 | 1/2009 | Souriau et al. |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0170230 A1 | 7/2009 | Kidu et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0269881 A1 | 10/2009 | Furuta et al. |
| 2009/0277386 A1 | 11/2009 | Takagi et al. |
| 2009/0279173 A1 | 11/2009 | Chui et al. |
| 2009/0302750 A1 | 12/2009 | Jun et al. |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0089443 A1 | 4/2010 | Bloomstein et al. |
| 2010/0090594 A1 | 4/2010 | Choi et al. |
| 2010/0130020 A1 | 5/2010 | Kim et al. |
| 2010/0156279 A1 | 6/2010 | Tamura et al. |
| 2010/0165454 A1 | 7/2010 | Suetsugu et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0239746 A1 | 9/2010 | Yamazaki et al. |
| 2010/0248416 A1 | 9/2010 | Priddy et al. |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0316791 A1 | 12/2010 | Lin |
| 2010/0316801 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0053301 A1 | 3/2011 | Kang et al. |
| 2011/0068331 A1 | 3/2011 | Koh et al. |
| 2011/0123707 A1 | 5/2011 | Lee et al. |
| 2011/0139069 A1 | 6/2011 | Ahn et al. |
| 2011/0165327 A1 | 7/2011 | Park et al. |
| 2011/0168986 A1 | 7/2011 | Lee et al. |
| 2011/0220019 A1 | 9/2011 | Lee et al. |
| 2011/0220022 A1 | 9/2011 | Hong et al. |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0006259 A1 | 1/2012 | Sung et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0028390 A1 | 2/2012 | Lee et al. |
| 2012/0068199 A1 | 3/2012 | Sung et al. |
| 2012/0068201 A1 | 3/2012 | Sung et al. |
| 2012/0070928 A1 | 3/2012 | Kim et al. |
| 2012/0083061 A1 | 4/2012 | Kang et al. |
| 2012/0097992 A1 | 4/2012 | Jeong |
| 2012/0100282 A1 | 4/2012 | Lee et al. |
| 2012/0103253 A1 | 5/2012 | Park et al. |
| 2012/0132137 A1 | 5/2012 | Oh et al. |

(56) References Cited

U.S. PATENT DOCUMENTS

| | | |
|---|---|---|
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0183676 A1 | 7/2012 | Sonoda et al. |
| 2012/0214263 A1 | 8/2012 | Yamazaki et al. |
| 2012/0295379 A1 | 11/2012 | Sonoda et al. |
| 2012/0299016 A1 | 11/2012 | Choi |
| 2012/0299023 A1 | 11/2012 | Lee et al. |
| 2012/0299024 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2012/0326157 A1 | 12/2012 | Park et al. |
| 2013/0001528 A1 | 1/2013 | Chang et al. |
| 2013/0008379 A1 | 1/2013 | Chang et al. |
| 2013/0009177 A1 | 1/2013 | Chang et al. |
| 2013/0032829 A1 | 2/2013 | Sung et al. |
| 2013/0157016 A1 | 6/2013 | Kim |
| 2013/0217158 A1 | 8/2013 | Lee |
| 2013/0217164 A1 | 8/2013 | Kang et al. |
| 2013/0267055 A1 | 10/2013 | Ro et al. |
| 2013/0291796 A1 | 11/2013 | Inoue et al. |
| 2013/0298829 A1 | 11/2013 | Jo et al. |
| 2013/0341598 A1 | 12/2013 | Chang et al. |
| 2014/0010957 A1 | 1/2014 | Inoue et al. |
| 2014/0014917 A1 | 1/2014 | Lee et al. |
| 2014/0014918 A1 | 1/2014 | Han |
| 2014/0014920 A1 | 1/2014 | Lee |
| 2014/0014921 A1 | 1/2014 | Choi |
| 2014/0014924 A1 | 1/2014 | Oh et al. |
| 2014/0014929 A1 | 1/2014 | Lee et al. |
| 2014/0034917 A1 | 2/2014 | Lee et al. |
| 2014/0045343 A1 | 2/2014 | Choi et al. |
| 2014/0077168 A1 | 3/2014 | Kim |
| 2014/0084262 A1 | 3/2014 | Kim |
| 2014/0084263 A1 | 3/2014 | Jin et al. |
| 2014/0110680 A1 | 4/2014 | Choe |
| 2014/0131667 A1 | 5/2014 | Chang |
| 2015/0122180 A1 | 5/2015 | Chang et al. |

FOREIGN PATENT DOCUMENTS

| | | |
|---|---|---|
| CN | 1500904 A | 6/2004 |
| CN | 1556872 A | 12/2004 |
| CN | 1607868 A | 4/2005 |
| CN | 1682569 A | 10/2005 |
| CN | 1704501 A | 12/2005 |
| CN | 1716102 A | 1/2006 |
| CN | 1814854 A | 8/2006 |
| CN | 1841696 A | 10/2006 |
| CN | 102005541 B | 8/2013 |
| EP | 1 413 644 | 4/2004 |
| EP | 1 418 250 A2 | 5/2004 |
| EP | 1 518 940 | 3/2005 |
| EP | 2354270 A1 | 8/2011 |
| JP | 57-194252 A2 | 11/1982 |
| JP | 2-247372 | 10/1990 |
| JP | 4-272170 | 9/1992 |
| JP | 5-22405 U1 | 3/1993 |
| JP | 1993-022405 U | 3/1993 |
| JP | 5-98425 A2 | 4/1993 |
| JP | 5-230628 A2 | 9/1993 |
| JP | 8-27568 A2 | 1/1996 |
| JP | 9-95776 A2 | 4/1997 |
| JP | 10-50478 | 2/1998 |
| JP | 10-120171 | 5/1998 |
| JP | 10-270535 | 10/1998 |
| JP | 11-144865 | 5/1999 |
| JP | 2000-68054 | 3/2000 |
| JP | 2000-282219 | 10/2000 |
| JP | 2000-323277 | 11/2000 |
| JP | 2001-028325 | 1/2001 |
| JP | 2001-52862 | 2/2001 |
| JP | 2001-93667 | 4/2001 |
| JP | 2002-75638 A2 | 3/2002 |
| JP | 2002-175878 | 6/2002 |
| JP | 2002-348659 A2 | 12/2002 |
| JP | 2003-3250 | 1/2003 |
| JP | 2003-77662 | 3/2003 |
| JP | 2003-157973 | 5/2003 |
| JP | 2003-197531 A2 | 7/2003 |
| JP | 2003-297562 | 10/2003 |
| JP | 2003-321767 A2 | 11/2003 |
| JP | 2003-347394 | 12/2003 |
| JP | 2004-035964 A2 | 2/2004 |
| JP | 2004-43898 | 2/2004 |
| JP | 2004-76150 A2 | 3/2004 |
| JP | 2004-91858 A2 | 3/2004 |
| JP | 2004-103269 | 4/2004 |
| JP | 2004-103341 | 4/2004 |
| JP | 2004-107764 A2 | 4/2004 |
| JP | 2004-137583 A2 | 5/2004 |
| JP | 2004-143521 A2 | 5/2004 |
| JP | 2004-169169 A2 | 6/2004 |
| JP | 2004-199919 | 7/2004 |
| JP | 2004-255058 | 8/2004 |
| JP | 2004-342455 | 12/2004 |
| JP | 2004-349101 | 12/2004 |
| JP | 2004-355975 | 12/2004 |
| JP | 2005-44592 | 2/2005 |
| JP | 2005-101505 | 4/2005 |
| JP | 2005-122980 A2 | 5/2005 |
| JP | 2005-163099 | 6/2005 |
| JP | 2005-165015 A2 | 6/2005 |
| JP | 2005-174843 A2 | 6/2005 |
| JP | 2005-206939 A2 | 8/2005 |
| JP | 2005-213616 | 8/2005 |
| JP | 2005-235568 | 9/2005 |
| JP | 2005-293968 | 10/2005 |
| JP | 2005-296737 | 10/2005 |
| JP | 2006-28583 A2 | 2/2006 |
| JP | 2006-172930 A2 | 6/2006 |
| JP | 2006-176809 A2 | 7/2006 |
| JP | 2006-210038 A2 | 8/2006 |
| JP | 2006-219760 | 8/2006 |
| JP | 2006-275433 | 10/2006 |
| JP | 2006-292955 A2 | 10/2006 |
| JP | 2006-307247 | 11/2006 |
| JP | 2007-47293 | 2/2007 |
| JP | 2007-66862 | 3/2007 |
| JP | 2007-146219 | 6/2007 |
| JP | 2007-157886 | 6/2007 |
| JP | 2007-186740 A2 | 7/2007 |
| JP | 2007-242436 | 9/2007 |
| JP | 2007-291506 A2 | 11/2007 |
| JP | 2008-019477 | 3/2008 |
| JP | 2008-108628 A | 5/2008 |
| JP | 2008-121098 | 5/2008 |
| JP | 2008-521165 A2 | 6/2008 |
| JP | 2008-156686 | 7/2008 |
| JP | 2008-196003 | 8/2008 |
| JP | 2008-248301 A2 | 10/2008 |
| JP | 2008-300056 | 12/2008 |
| JP | 2009-19243 | 1/2009 |
| JP | 2009-24208 A2 | 2/2009 |
| JP | 2009-049223 | 3/2009 |
| JP | 2009-81165 A2 | 4/2009 |
| JP | 2009-87910 | 4/2009 |
| JP | 2009-117231 | 5/2009 |
| JP | 2009-520110 | 5/2009 |
| JP | 2008-274373 | 11/2009 |
| JP | 2010-140840 | 6/2010 |
| JP | 2010-159167 | 7/2010 |
| JP | 2010-261081 A2 | 11/2010 |
| JP | 2011-47035 | 3/2011 |
| JP | 2011-146377 | 7/2011 |
| JP | 2012-95448 | 5/2012 |
| JP | 2012-211352 | 11/2012 |
| KR | 1997-0008709 | 2/1997 |
| KR | 1997-0008709 A | 2/1997 |
| KR | 10-0257219 | 2/2000 |
| KR | 10-2000-0019254 | 4/2000 |
| KR | 10-2000-0023929 | 5/2000 |

(56) References Cited

FOREIGN PATENT DOCUMENTS

| | | |
|---|---|---|
| KR | 2001-0024652 A | 3/2001 |
| KR | 2001-0030175 A | 4/2001 |
| KR | 10-2001-0039298 A | 5/2001 |
| KR | 10-2001-0059939 | 7/2001 |
| KR | 10-2001-0092914 A | 10/2001 |
| KR | 2001-0093666 A | 10/2001 |
| KR | 20-0257218 Y1 | 12/2001 |
| KR | 10-2002-0000201 | 1/2002 |
| KR | 2002-0001555 A | 1/2002 |
| KR | 2002-0025760 | 4/2002 |
| KR | 10-2002-0050922 | 6/2002 |
| KR | 10-2002-0088662 | 11/2002 |
| KR | 10-2002-0090934 | 12/2002 |
| KR | 10-2002-0091457 A | 12/2002 |
| KR | 2003-0001745 A | 1/2003 |
| KR | 2003-0034730 A | 5/2003 |
| KR | 10-2003-0043012 | 6/2003 |
| KR | 2003-0046090 A | 6/2003 |
| KR | 2003-0069684 A | 8/2003 |
| KR | 10-0397635 B1 | 9/2003 |
| KR | 10-0405080 | 10/2003 |
| KR | 10-0406059 | 11/2003 |
| KR | 10-2003-0091947 | 12/2003 |
| KR | 10-2003-0093959 | 12/2003 |
| KR | 2003-0094033 A | 12/2003 |
| KR | 10-2004-0014258 A | 2/2004 |
| KR | 20-0342433 Y1 | 2/2004 |
| KR | 10-2004-0034537 | 4/2004 |
| KR | 10-2004-0039910 A | 5/2004 |
| KR | 10-0430336 A1 | 5/2004 |
| KR | 10-2004-0050045 | 6/2004 |
| KR | 10-2004-0069281 | 8/2004 |
| KR | 10-2004-0084747 | 10/2004 |
| KR | 10-2004-0087142 A | 10/2004 |
| KR | 10-2004-0110718 A | 12/2004 |
| KR | 10-0463212 | 12/2004 |
| KR | 10-2005-0018234 A | 2/2005 |
| KR | 10-2005-0024324 | 3/2005 |
| KR | 10-2005-0028943 | 3/2005 |
| KR | 10-2005-0039140 A | 4/2005 |
| KR | 10-0483487 B1 | 4/2005 |
| KR | 10-2005-0062853 A | 6/2005 |
| KR | 10-2005-0082644 A | 8/2005 |
| KR | 10-0520159 | 9/2005 |
| KR | 10-0532657 B1 | 12/2005 |
| KR | 10-2006-001033 | 1/2006 |
| KR | 10-2006-0008602 | 1/2006 |
| KR | 10-2006-0018745 | 3/2006 |
| KR | 10-2006-0020050 A | 3/2006 |
| KR | 10-2006-0045225 A | 5/2006 |
| KR | 10-2006-0049050 A | 5/2006 |
| KR | 10-2006-0051746 A | 5/2006 |
| KR | 10-2006-0053926 A | 5/2006 |
| KR | 10-2006-0056706 A | 5/2006 |
| KR | 10-2006-0058459 A | 5/2006 |
| KR | 10-2009-0052828 A | 5/2006 |
| KR | 10-2006-0059068 A | 6/2006 |
| KR | 10-2006-0059323 A | 6/2006 |
| KR | 10-2006-0060994 | 6/2006 |
| KR | 10-2006-0065978 A | 6/2006 |
| KR | 10-2006-0073367 | 6/2006 |
| KR | 10-2006-0075887 A | 7/2006 |
| KR | 10-2006-0077887 | 7/2006 |
| KR | 10-2006-0080475 | 7/2006 |
| KR | 10-2006-0080481 | 7/2006 |
| KR | 10-2006-0080482 | 7/2006 |
| KR | 10-2006-0081943 A | 7/2006 |
| KR | 10-2006-0083510 | 7/2006 |
| KR | 10-2006-0092387 A | 8/2006 |
| KR | 10-2006-0098755 A | 9/2006 |
| KR | 10-2006-0104288 A | 10/2006 |
| KR | 10-2006-0104675 | 10/2006 |
| KR | 10-2006-0104677 | 10/2006 |
| KR | 10-2006-0109561 A | 10/2006 |
| KR | 10-2006-0109627 | 10/2006 |
| KR | 10-0635903 B1 | 10/2006 |
| KR | 10-2006-0114462 A | 11/2006 |
| KR | 10-2006-0114477 A | 11/2006 |
| KR | 10-2006-0114573 A | 11/2006 |
| KR | 10-0645719 B1 | 11/2006 |
| KR | 10-0646160 | 11/2006 |
| KR | 10-2006-0123944 A | 12/2006 |
| KR | 10-0687007 | 2/2007 |
| KR | 10-2007-0025164 | 3/2007 |
| KR | 10-0696547 | 3/2007 |
| KR | 10-0696550 B1 | 3/2007 |
| KR | 10-0697663 B1 | 3/2007 |
| KR | 10-0698033 | 3/2007 |
| KR | 10-0700466 | 3/2007 |
| KR | 10-2007-0035796 | 4/2007 |
| KR | 10-2007-0037848 A | 4/2007 |
| KR | 10-0711885 | 4/2007 |
| KR | 10-2007-0050793 | 5/2007 |
| KR | 10-0723627 | 5/2007 |
| KR | 10-2007-0056190 | 6/2007 |
| KR | 10-2007-0056190 A | 6/2007 |
| KR | 10-0726132 | 6/2007 |
| KR | 10-0736218 B1 | 6/2007 |
| KR | 10-0741142 B1 | 7/2007 |
| KR | 10-2007-0078713 | 8/2007 |
| KR | 10-2007-0080635 | 8/2007 |
| KR | 10-2007-0091437 | 9/2007 |
| KR | 10-2006-0028115 | 10/2007 |
| KR | 10-2007-0097218 | 10/2007 |
| KR | 10-2007-0098122 A | 10/2007 |
| KR | 10-2007-0101842 | 10/2007 |
| KR | 10-2007-0105595 | 10/2007 |
| KR | 10-0768212 B1 | 10/2007 |
| KR | 10-0770653 | 10/2007 |
| KR | 10-2007-0112668 A | 11/2007 |
| KR | 10-2007-0114094 A | 11/2007 |
| KR | 10-0739309 B1 | 12/2007 |
| KR | 10-0787457 B1 | 12/2007 |
| KR | 10-2008-0001184 | 1/2008 |
| KR | 10-2008-0003720 A | 1/2008 |
| KR | 10-2008-0007896 | 1/2008 |
| KR | 10-2008-0009285 | 1/2008 |
| KR | 10-0797787 | 1/2008 |
| KR | 10-0800125 | 1/2008 |
| KR | 10-0815265 | 3/2008 |
| KR | 10-2008-0036983 A | 4/2008 |
| KR | 10-0823508 | 4/2008 |
| KR | 10-0823511 B1 | 4/2008 |
| KR | 10-0827760 | 4/2008 |
| KR | 10-2008-0044239 | 5/2008 |
| KR | 10-2008-0044775 A | 5/2008 |
| KR | 10-2008-0046761 | 5/2008 |
| KR | 10-2008-0046761 A | 5/2008 |
| KR | 10-2008-0048653 | 6/2008 |
| KR | 10-2008-0055124 A | 6/2008 |
| KR | 10-2008-0057159 | 6/2008 |
| KR | 10-0839380 | 6/2008 |
| KR | 10-2008-0060400 | 7/2008 |
| KR | 10-2008-0061132 | 7/2008 |
| KR | 10-2008-0061666 A | 7/2008 |
| KR | 10-2008-0061774 A | 7/2008 |
| KR | 10-2008-0062212 | 7/2008 |
| KR | 10-2008-0076574 | 8/2008 |
| KR | 10-2008-0088737 A | 10/2008 |
| KR | 10-2008-0104479 | 12/2008 |
| KR | 10-2008-0104695 | 12/2008 |
| KR | 10-2008-0109559 A | 12/2008 |
| KR | 10-2009-0017910 A | 2/2009 |
| KR | 10-0889872 B1 | 3/2009 |
| KR | 10-2009-0038733 | 4/2009 |
| KR | 10-2009-0040618 A | 4/2009 |
| KR | 10-2009-0047953 A | 5/2009 |
| KR | 10-2009-0052155 A | 5/2009 |
| KR | 10-2009-0053417 A | 5/2009 |
| KR | 10-0899279 B1 | 5/2009 |
| KR | 10-2009-0066996 | 6/2009 |
| KR | 10-2009-0075887 A | 7/2009 |
| KR | 10-2009-0079765 A | 7/2009 |
| KR | 10-2009-0081717 | 7/2009 |

(56) References Cited

FOREIGN PATENT DOCUMENTS

| | | |
|---|---|---|
| KR | 10-0908232 B1 | 7/2009 |
| KR | 10-2009-0093161 A | 9/2009 |
| KR | 10-2009-0094911 | 9/2009 |
| KR | 10-2009-0097453 | 9/2009 |
| KR | 10-2009-0107702 | 10/2009 |
| KR | 10-0922763 A | 10/2009 |
| KR | 10-2010-0000128 A | 1/2010 |
| KR | 10-2010-000129 A | 1/2010 |
| KR | 10-2010-0002381 A | 1/2010 |
| KR | 10-2010-0026655 A | 3/2010 |
| KR | 10-2010-0038088 | 4/2010 |
| KR | 10-2010-0044606 | 4/2010 |
| KR | 10-2010-0047796 | 5/2010 |
| KR | 10-0961110 B1 | 6/2010 |
| KR | 10-2010-0090070 A | 8/2010 |
| KR | 10-2010-0099806 A | 9/2010 |
| KR | 10-2010-0119368 A | 11/2010 |
| KR | 10-2010-0126125 A | 12/2010 |
| KR | 10-2010-0128589 | 12/2010 |
| KR | 10-2010-0130786 A | 12/2010 |
| KR | 10-2010-133678 A | 12/2010 |
| KR | 10-2010-0138139 A | 12/2010 |
| KR | 10-1017654 B1 | 2/2011 |
| KR | 10-2011-0021090 A | 3/2011 |
| KR | 10-2011-0022512 A | 3/2011 |
| KR | 10-2011-0032589 A | 3/2011 |
| KR | 10-2011-0082418 A | 7/2011 |
| KR | 10-2011-0101767 A | 9/2011 |
| KR | 10-2011-0110525 A | 10/2011 |
| KR | 10-2011-0120213 A | 11/2011 |
| KR | 10-2011-0138787 A | 12/2011 |
| KR | 10-2012-0006322 A | 1/2012 |
| KR | 10-2012-0006324 A | 1/2012 |
| KR | 10-2012-0012300 | 2/2012 |
| KR | 10-2012-0042155 A | 5/2012 |
| KR | 10-2012-0060498 | 6/2012 |
| KR | 10-2012-0065789 A | 6/2012 |
| KR | 10-2012-0080855 A | 7/2012 |
| KR | 10-2012-0081811 A | 7/2012 |
| KR | 10-1193186 B1 | 10/2012 |
| KR | 10-2012-0131545 A | 12/2012 |
| KR | 10-2013-0004830 | 1/2013 |
| KR | 10-2013-0007308 A | 1/2013 |
| WO | 9925894 A1 | 5/1999 |
| WO | WO 03/043067 A1 | 5/2003 |
| WO | WO 2004/016406 | 2/2004 |
| WO | 2008004792 A1 | 1/2008 |

OTHER PUBLICATIONS

Korean Patent Abstracts, Publication No. 10-2007-0056241, dated Jun. 4, 2007, corresponding to Korean Patent 10-0741142 B1 listed above.
Korean Patent Abstracts, Publication No. 10-2008-0070302, dated Jul. 30, 2008, corresponding to Korean Patent 10-0899279 B1 listed above.
KIPO Office action dated Apr. 9, 2012, for Korean priority Patent application 10-2010-0031556, (4 pages).
KIPO Notice of Allowance dated Apr. 26, 2012, for Korean Patent application 10-2010-0066991, (5 pages).
English-language abstract of Korean Publication No. KR 10-2002-0034272.
English-language abstract of Korean Publication No. KR 10-2002-0056238.
English-language abstract of Korean Publication No. KR 10-2002-0088662.
English-language abstract of Korean Publication No. KR 10-2005-0045619.
English-language abstract of Korean Publication No. KR 10-2006-0126267.
English-language abstract of Korean Publication No. KR 10-2008-0038650.
U.S. Appl. No. 12/784,774, filed May 21, 2010, Choong-Ho Lee et al., Samsung Mobile Display Co., Ltd.
U.S. Appl. No. 13/014,225, filed Jan. 26, 2011, Jong-Won Hong et al., Samsung Mobile Display Co., Ltd.
U.S. Appl. No. 12/797,858, filed Jun. 10, 2010, Choong-Ho Lee et al., Samsung Mobile Display Co., Ltd.
U.S. Appl. No. 12/836,760, filed Jul. 15, 2010, Jong-Heon Kim, et al., Samsung Mobile Display Co., Ltd.
U.S. Appl. No. 12/784,804, filed May 21, 2010, Choong-Ho Lee, et al., Samsung Mobile Display Co., Ltd.
U.S. Appl. No. 12/849,193, filed Aug. 3, 2010, Ji-Sook Oh et al., Samsung Mobile Display Co., Ltd.
U.S. Appl. No. 12/979,193, filed Dec. 28, 2010, Hyun Sook Park et al., Samsung Mobile Display Co., Ltd.
U.S. Appl. No. 12/820,355, filed Jun. 22, 2010, Yong-Sup Choi et al., Samsung Mobile Display Co., Ltd.
U.S. Appl. No. 12/950,361, filed Nov. 19, 2010, Choong-Ho Lee, et al., Samsung Mobile Display Co., Ltd.
U.S. Appl. No. 12/795,896, filed Jun. 8, 2010, Jung-Min Lee, et al., Samsung Mobile Display Co., Ltd.
U.S. Appl. No. 12/856,942, filed Aug. 16, 2010, Yun-Mi Lee et al., Samsung Mobile Display Co., Ltd.
U.S. Appl. No. 12/814,816, filed Jun. 14, 2010, Jung-Min Lee et al., Samsung Mobile Display Co., Ltd.
U.S. Appl. No. 12/868,099, filed Aug. 25, 2010, Hee-Cheol Kang, et al., Samsung Mobile Display Co., Ltd.
U.S. Appl. No. 12/862,153, filed Aug. 24, 2010, Hee-Cheol Kang, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, filed Sep. 1, 2010, Young-Mook Choi, et al., Samsung Mobile Display Co., Ltd.
U.S. Appl. No. 12/815,673, filed Jun. 15, 2010, Jung-Min Lee, Samsung Mobile Display Co., Ltd.
U.S. Appl. No. 12/794,093, filed Jun. 4, 2010, Jung-Min Lee et al., Samsung Mobile Display Co., Ltd.
U.S. Appl. No. 12/862,125, filed Aug. 24, 2010, Jae-Kwang Ryu et al., Samsung Mobile Display Co., Ltd.
U.S. Appl. No. 12/795,001, filed Jun. 7, 2010, Choong-Ho Lee et al., Samsung Mobile Display Co., Ltd.
U.S. Appl. No. 12/813,786, filed Jun. 11, 2010, Choong-Ho Lee et al., Samsung Mobile Display Co., Ltd.
U.S. Appl. No. 12/820,270, filed Jun. 22, 2010, Jung-Min Lee et al., Samsung Mobile Display Co., Ltd.
U.S. Appl. No. 12/907,396, filed Oct. 19, 2010, Yong-Sup Choi, et al., Samsung Mobile Display Co., Ltd.
U.S. Appl. No. 12/987,569, filed Jan. 10, 2011, Yun-Mi Lee et al., Samsung Mobile Display Co., Ltd.
U.S. Appl. No. 12/984,289, filed Jan. 4, 2011, Jung-Yeong Kim et al., Samsung Mobile Display Co., Ltd.
KIPO Office action dated Feb. 6, 2012, for Korean Patent application 10-2010-0011481, 7 pages.
KIPO Office action dated Feb. 6, 2012, for Korean Patent application 10-2010-0011480, 8 pages.
European Search Report dated May 27, 2011, for corresponding European Patent application 10251514.5, 11 pages.
U.S. Office action dated Jun. 21, 2011, for cross-reference U.S. Appl. No. 12/862,153, 21 pages.
U.S. Appl. No. 13/031,756, filed Feb. 22, 2011, Yong Sup Choi et al., Samsung Mobile Display Co., Ltd.
SIPO Office action dated Oct. 9, 2012, for corresponding Chinese Patent application 201010266406.6, (6 pages).
KIPO Registration Determination Certificate dated Jul. 2, 2012, for Korean priority Patent application 10-2010-0011480, (5 pages).
KIPO Registration Determination Certificate dated Jul. 2, 2012, for Korean Patent application 10-2010-0011481, (5 pages).
U.S. Office Action dated May 22, 2013 for cross-reference U.S. Appl. No. 13/219,427 (26 pages).
U.S. Office Action dated Jun. 17, 2013 for cross-reference U.S. Appl. No. 13/180,454 (23 pages).

(56) References Cited

OTHER PUBLICATIONS

U.S. Office Action dated Aug. 2, 2013 for cross-reference U.S. Appl. No. 12/868,099 (32 pages).
U.S. Office Action dated Sep. 25, 2013 for cross-reference U.S. Appl. No. 13/031,756 (34 pages).
U.S. Office Action dated Nov. 4, 2013 for U.S. Appl. No. 13/219,427 (26 pgs.).
U.S. Office Action dated Nov. 20, 2013 for U.S. Appl. No. 12/868,099 (14 pgs.).
European Search Report dated May 12, 2011 for European Application No. 11250019.4 (6 pages).
European Search Report dated May 20, 2011 for European Application No. 10251404.9 (12 pages).
European Search Report dated Sep. 6, 2010 for European Application No. 10250962.7 (5 pages).
Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JP Office action dated Aug. 21, 2012, issued to JP Application No. 2010-145075 (5 pages).
JP Office action dated Sep. 4, 2012, issued to JP Application No. 2010-152846 (4 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Apr. 30, 2012, issued to KR 10-2010-0066992 (5 pages).
KIPO Notice of Allowance dated Aug. 24, 2012, issued to KR 10-2010-0066993 (5 pages).
KIPO Notice of Allowance dated Jul. 20, 2012, issued to KR 10-2010-0003545 (5 pages).
KIPO Notice of Allowance dated Oct. 27, 2011 for Korean Application No. 10-2010-0002381 (5 pages).
KIPO Notice of Allowance dated Oct. 31, 2011, for Korean Patent application 10-2010-0014273, (5 pages).
KIPO Notice of Allowance dated Sep. 1, 2012, for Korean Patent application 10-2010-0013847 (5 pages).
KIPO Notice of Allowance dated Sep. 1, 2012, issued to KR 10-2010-0009160 (5 pages).
KIPO Notice of Allowance dated Sep. 1, 2012, issued to KR 10-2010-0013848 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Notice of Allowance, dated Nov. 25, 2011, issued to KR 10-2010-0014277 (5 pages).
KIPO Notice of Allowance, dated Sep. 1, 2012, issued to KR 10-2010-0014276 (5 pages).
KIPO Notice of Allowance, dated Sep. 28, 2011, issued to KR 10-2009-0052357 (5 pages).
KIPO Office action dated Apr. 2, 2012, issued to KR 10-2010-0066993 (4 pages).
KIPO Office action dated Apr. 4, 2012, issued in KR Application No. 10-2009-0112796 (5 pages).
KIPO Office action dated Aug. 1, 2011, issued to KR 10-2009-0074001 (3 pages).
KIPO Office Action dated Aug. 28, 2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0011196 (4 pages).
KIPO Office action dated Feb. 1, 2012, issued to KR 10-2010-0013848 (4 pages).
KIPO Office Action dated Feb. 1, 2012, issued to KR 10-2010-0014272 (4 pages).
KIPO Office Action dated Feb. 6, 2012, issued to KR 10-2010-0014274 (9 pages).
KIPO Office Action dated Feb. 6, 2012, issued to KR 10-2010-0021835 (4 pages).
KIPO Office action dated Jan. 13, 2012, issued to KR 10-2009-0056529 (5 pages).
KIPO Office action dated Jan. 6, 2012, issued to KR 10-2010-0000897 (4 pages).
KIPO Office action dated Jul. 1, 2011, issued to KR 10-2009-0072111 (4 pages).
KIPO Office action dated Jun. 1, 2011, issued to KR Application No. 10-2009-0050528 (4 pages).
KIPO Office action dated Mar. 21, 2012, issued to KR Application No. 10-2010-0065465 (5 pages).
KIPO Office action dated Sep. 1, 2012, issued to KR 10-2010-0010136 (5 pages).
KIPO Registration Determination Certificate dated Nov. 30, 2011, for Korean application 10-2009-0056530 (5 pages).
KIPO Registration Determination Certificate, dated Jul. 20, 2012, issued to KR Application No. 10-2010-0000897 (5 pages).
Korean Registration Certificate dated Sep. 28, 2011 for Korean Application No. 10-2009-0045200 (5 pages).
SIPO Certificate of Patent dated Aug. 14, 2013, for Chinese application 20100266406.6, (36 pages).
SIPO Certificate of Patent dated Jul. 31, 2013, corresponding to Chinese Patent application 201110029291.3, (31 pages).
SIPO Office action dated Dec. 17, 2013, for Chinese Patent application 2010010216896.9 (6 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 2011110029291.3 (11 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated May 9, 2014 for U.S. Appl. No. 13/194,759 (27 pages).
U.S. Office action dated Apr. 1, 2013, issued to U.S. Appl. No. 12/784,774 (44 pages).
U.S. Office action dated Apr. 29, 2013, issued to U.S. Appl. No. 12/820,355 (31 pages).
U.S. Office action dated Aug. 13, 2013, issued to U.S. Appl. No. 13/194,759, (28 pages).
U.S. Office action dated Aug. 21, 2013 issued in cross-reference U.S. Appl. No. 12/820,355 (14 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office Action dated Dec. 16, 2013 for U.S. Appl. No. 14/054,536 (35 pages).
U.S. Office action dated Dec. 17, 2012, issued to U.S. Appl. No. 12/873,556 (37 pages).
U.S. Office action dated Dec. 26, 2012, issued to U.S. Appl. No. 12/815673 (21 pages).
U.S. Office action dated Feb. 11, 2014, for cross reference U.S. Appl. No. 13/178,472 (8 pages).

(56) References Cited

OTHER PUBLICATIONS

U.S. Office action dated Feb. 26, 2013, issued to U.S. Appl. No. 12/794,093 (31 pages).
U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 11, 2013, issued to U.S. Appl. No. 12/862,125 (37 pages).
U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 17, 2014, for U.S. Appl. No. 12/950,361 (48 pages).
U.S. Office action dated Mar. 18, 2013, issued to U.S. Appl. No. 12/984,231 (29 pages).
U.S. Office action dated Mar. 19, 2013, issued to U.S. Appl. No. 13/194,759 (36 pages).
U.S. Office action dated Mar. 22, 2013, issued to U.S. Appl. No. 12/987,569 (12 pages).
U.S. Office Action dated Mar. 23, 2012 for U.S. Appl. No. 12/849,193 (17 pages).
U.S. Office action dated May 24, 2013, for U.S. Appl. No. 13/279,077 (20 pages).
U.S. Office action dated May 24, 2013, issued to U.S. Appl. No. 12/849,092 (31 pages)_.
U.S. Office Action dated May 7, 2013, issued in U.S. Appl. No. 12/820,27 (37 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
U.S. Office action dated Oct. 7, 2013, issued to U.S. Appl. No. 13/279,077, (29 pages).
U.S. Office action dated Sep. 20, 2013, issued to U.S. Appl. No. 13/014,225, (33 pages).
U.S. Patent Office Action dated May 16, 2013, issued to U.S. Appl. No. 13/235,337 (28 pages).
U.S. Notice of Allowance, dated Mar. 18, 2013, issued to U.S. Appl. No. 12/795,001 (29 pages).
U.S. Office action dated Dec. 20, 2012, issued to U.S. Appl. No. 12/984,289 (20pages).
U.S. Office action dated Sep. 12, 2012, in U.S. Appl. No. 12/515,673 (26 pages).
U.S. Notice of Allwance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).
U.S. Notice of Allowance dated Jun. 11, 2014, issued to U.S. Appl. No. 13/468,835 (62 pages).
U.S. Office action dated Apr. 18, 2014, issued to U.S. Appl. No. 12/814,816 (9 pages).
U.S. Office action dated Dec. 13, 2013, issued to U.S. Appl. No. 13/180,454 (18 pages).
U.S. Office action dated Dec. 2, 2013, issued to U.S. Appl. No. 13/157,220 (33 pages).
U.S. Office action dated May 21, 2014, issued to U.S. Appl. No. 13/014,225 (15 pages).
U.S. Office action dated May 6, 2014, issued to U.S. Appl. No. 13/467,998 (21 pages).
U.S. Office action dated Sep. 27, 2013, issued to U.S. Appl. No. 12/814,816 (19 pages).
U.S. Notice of Allowance dated Jun. 30, 2014, issued to U.S. Appl. No. 12/907,396 (40 pages).
U.S. Office action dated Jun. 17, 2014, issued to U.S. Appl. No. 13/157,220 (36 pages).
JPO Office action dated Jan. 20, 2015 for corresponding Japanese Patent application 2011-118686 (5 pages).
SIPO Office action dated Feb. 2, 2015, for corresponding Chinese Patent application 201110199594.X (12 pages).
U.S. Notice of Allowance dated Oct. 28, 2014, issued to U.S. Appl. No. 13/014,225 (64 pages).
U.S. Office action dated Dec. 31, 2014 issued to U.S. Appl. No. 12/873,556, (72 pages).
U.S. Office action dated Dec. 31, 2014, issued to U.S. Appl. No. 13/469,029 (74 pages).
U.S. Office action dated Nov. 14, 2014, issued to U.S. Appl. No. 13/178,472 (10 pages).
U.S. Office action dated Sep. 26, 2014, issued to U.S. Appl. No. 12/868,099 (66 pages).
EPO Search Report dated May 13, 2011 for European Patent application 11250019.4, (6 pages).
EPO Search Report dated Oct. 11, 2012 for European Patent application 12174739.8, (5 pages).
U.S. Notice of Allowance dated Apr. 17, 2014 for U.S. Appl. No. 13/797,836, (10 pages).
U.S. Office action dated Jun. 19, 2015 for U.S. Appl. No. 14/012,924, (30 pages).
U.S. Office action dated Mar. 16, 2015 for U.S. Appl. No. 13/654,378, (12 pages).
Korean Patent Abstracts for Korean Publication 10-2003-0013721, dated Feb. 15, 2003, corresponding to Korean Patent 10-0397635 dated Sep. 13, 2003, listed above.

* cited by examiner

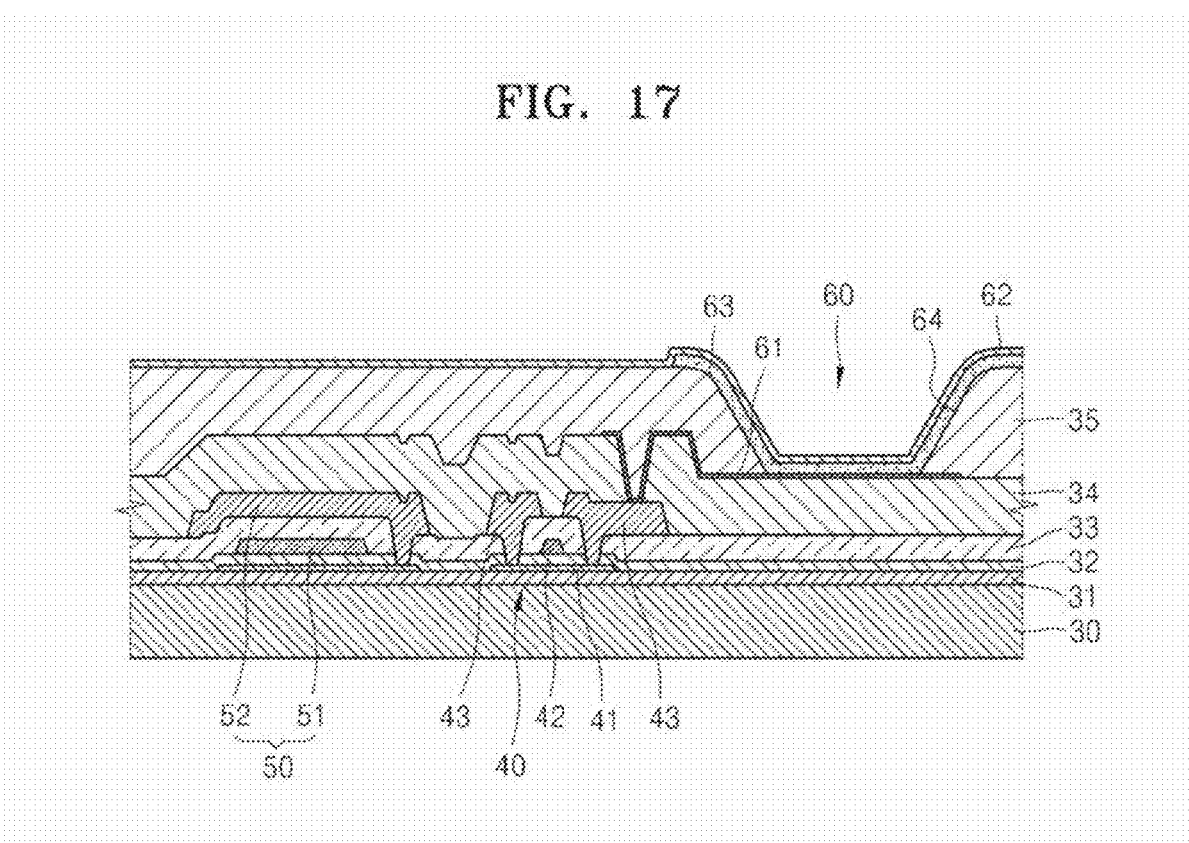

THIN FILM DEPOSITION APPARATUS AND METHOD OF MANUFACTURING ORGANIC LIGHT-EMITTING DISPLAY APPARATUS USING THE SAME

CROSS-REFERENCE TO RELATED APPLICATIONS

This application claims the benefit of Korean Patent Application Nos. 10-2009-0079765, filed on Aug. 27, 2009, and 10-2010-0011480, filed on Feb. 8, 2010, in the Korean Intellectual Property Office, the disclosures of which are incorporated herein in their entirety by reference.

BACKGROUND

1. Field

An aspect of the present invention relates to a thin film deposition apparatus and a method of manufacturing an organic light-emitting display apparatus by using the same, and more particularly, to a thin film deposition apparatus that can be easily used to manufacture large substrates on a mass scale and that improves manufacturing yield, and a method of manufacturing an organic light-emitting display apparatus by using the thin film deposition apparatus.

2. Description of the Related Art

Organic light-emitting display apparatuses have a larger viewing angle, better contrast characteristics, and a faster response rate than other display apparatuses, and thus have drawn attention as next-generation display apparatuses.

An organic light-emitting display apparatus includes intermediate layers, including an emission layer disposed between a first electrode and a second electrode that are arranged opposite to each other. The electrodes and the intermediate layers may be formed using a variety of methods, one of which is a deposition method. When an organic light-emitting display apparatus is manufactured by using the deposition method, a fine metal mask (FMM) having the same pattern as a thin film to be formed is disposed in close contact with a substrate, and a thin film material is deposited over the FMM in order to form the thin film having the desired pattern.

However, when the FMM is used, it is not easy to form an organic thin film pattern on a large substrate, such as a mother glass having a large size. In other words, when the large-sized mask is used, the mask may be bent due to self-gravity, and the organic thin film pattern may be distorted due to the bent mask. This is not desirable for high definition patterning which is being increasingly used recently.

SUMMARY

An aspect of the present invention provides a thin film deposition apparatus that may be easily manufactured, that may be easily used to manufacture large-sized display apparatuses on a mass scale and that allows high-definition patterning, and a method of manufacturing an organic light-emitting display apparatus by using the thin film deposition apparatus.

According to an aspect of the present invention, there is provided a thin film deposition apparatus including: a loading unit fixing a substrate that is a deposition target, onto an electrostatic chuck; a deposition unit including a chamber maintained in a vacuum state and a thin film deposition assembly disposed in the chamber, separated from the substrate by a predetermined distance, for depositing a thin film on the substrate fixed on the electrostatic chuck; an unloading unit separating the substrate on which a deposition process is completed, from the electrostatic chuck; a first circulation unit sequentially moving the electrostatic chuck on which the substrate is fixed, to the loading unit, the deposition unit, and the unloading unit; and a second circulation unit returning the electrostatic chuck separated from the substrate to the loading unit from the unloading unit, wherein the first circulation unit is disposed to pass through the chamber when passing through the deposition unit.

According to another aspect of the present invention, a plurality of thin film deposition assemblies may be disposed in the chamber.

According to another aspect of the present invention, the chamber may include a first chamber and a second chamber each including a plurality of thin film deposition assemblies, and the first chamber and the second chamber may be connected to each other.

According to another aspect of the present invention, the first circulation unit or the second circulation unit may include a carrier that allows the electrostatic chuck to be moved.

According to another aspect of the present invention, the carrier may include: a support installed to pass through the chamber and including a first support and a second support each extending along the first circulation unit or the second circulation unit; a moving bar disposed on the first support, to support edges of the electrostatic chuck; and a first driving unit interposed between the first support and the moving bar, to allow the moving bar to be moved along the first support.

According to another aspect of the present invention, the thin film deposition assembly may include: a deposition source that discharges a deposition material; a deposition source nozzle unit that is disposed at a side of the deposition source and includes a plurality of deposition source nozzles arranged in a first direction; and a patterning slit sheet that is disposed opposite to the deposition source nozzle unit and includes a plurality of patterning slits arranged in a second direction perpendicular to the first direction, and wherein a deposition process is performed while the substrate is moved relative to the thin film deposition assembly in the first direction, and the deposition source, the deposition source nozzle unit, and the patterning slit sheet are integrally formed as one body.

According to another aspect of the present invention, the deposition source and the deposition source nozzle unit, and the patterning slit sheet may be integrally connected as one body by a connection member that guides flow of the deposition material.

According to another aspect of the present invention, the connection member may seal a space between the deposition source and the deposition source nozzle unit, and the patterning slit sheet.

According to another aspect of the present invention, the plurality of deposition source nozzles may be tilted at a predetermined angle.

According to another aspect of the present invention, the plurality of deposition source nozzles may include deposition source nozzles arranged in two rows formed in the first direction, and the deposition source nozzles in the two rows are tilted to face each other.

According to another aspect of the present invention, the plurality of deposition source nozzles may include deposition source nozzles arranged in two rows formed in the first direction, the deposition source nozzles of a row located at a first side of the patterning slit sheet are arranged to face a second side of the patterning slit sheet, and the deposition source nozzles of the other row located at the second side of the patterning slit sheet are arranged to face the first side of the patterning slit sheet.

According to another aspect of the present invention, the thin film deposition assembly may include: a deposition source that discharges a deposition material; a deposition source nozzle unit that is disposed at a side of the deposition source and includes a plurality of deposition source nozzles arranged in a first direction; a patterning slit sheet that is disposed opposite to the deposition source nozzle unit and includes a plurality of patterning slits arranged in the first direction; and a barrier wall assembly that is disposed between the deposition source nozzle unit and the patterning slit sheet in the first direction, and includes a plurality of barrier walls that partition a space between the deposition source nozzle unit and the patterning slit sheet into a plurality of sub-deposition spaces, and wherein the thin film deposition assembly is disposed to be separated from the substrate, and the thin film deposition assembly or the substrate is moved relative to the other.

According to another aspect of the present invention, each of the plurality of barrier walls may extend in a second direction that is substantially perpendicular to the first direction.

According to another aspect of the present invention, the barrier wall assembly may include a first barrier wall assembly including a plurality of first barrier walls, and a second barrier wall assembly including a plurality of second barrier walls.

According to another aspect of the present invention, each of the first barrier walls and each of the second barrier walls may extend in a second direction that is substantially perpendicular to the first direction.

According to another aspect of the present invention, the first barrier walls may be arranged to respectively correspond to the second barrier walls.

According to another aspect of the present invention, the deposition source and the barrier wall assembly may be separated from each other.

According to another aspect of the present invention, the barrier wall assembly and the patterning slit sheet may be separated from each other.

The patterning slit sheet may include a first mark, and the substrate may include a second mark, and the thin film deposition assembly may include a camera assembly for capturing a degree of alignment of the first mark and the second mark, and wherein the camera assembly includes: a hood having an opening formed in one end of the hood; a camera installed in the hood; an optical system disposed between the camera and the opening; a protection window disposed between the optical system and the opening; and a heater disposed on the protection window.

The patterning slit sheet may include a first mark, and the substrate may include a second mark, and the thin film deposition assembly may further include a camera assembly for capturing a degree of alignment of the first mark and the second mark, and a second driving unit for driving the thin film deposition assembly so as to align the first mark with the second mark by using information about the degree of alignment of the first mark and the second mark obtained by the camera assembly.

The thin film deposition apparatus may further include: a source chamber which is connected to the chamber and in which the deposition source of the thin film deposition assembly is accommodated; a valve opening or closing a space between the chamber and the source chamber; and a shutter closing the space between the chamber and the source chamber when the deposition source is located at the chamber.

The patterning slit sheet may further include a first mark, and the substrate may include a second mark, and the thin film deposition assembly may include a camera assembly for capturing a degree of alignment of the first mark and the second mark, and wherein the camera assembly includes: a hood having an opening formed in one end of the hood; a camera installed in the hood; an optical system disposed between the camera and the opening; a protection window disposed between the optical system and the opening; and a heater disposed on the protection window.

The patterning slit sheet may include a first mark, and the substrate may include a second mark, and the thin film deposition assembly may further include a camera assembly for capturing a degree of alignment of the first mark and the second mark, and a second driving unit for driving the thin film deposition assembly so as to align the first mark with the second mark by using information about the degree of alignment of the first mark and the second mark obtained by the camera assembly.

The thin film deposition apparatus may further include: a source chamber which is connected to the chamber and in which the deposition source of the thin film deposition assembly is accommodated; a valve opening or closing a space between the chamber and the source chamber; and a shutter closing the space between the chamber and the source chamber when the deposition source is located at the chamber.

According to another aspect of the present invention, there is provided a method of manufacturing an organic light-emitting display apparatus, the method including: fixing a substrate that is a deposition target, on an electrostatic chuck; conveying the electrostatic chuck on which the substrate is fixed, into a chamber that is maintained in a vacuum state by using a first circulation unit installed to pass through the chamber; using a thin film deposition assembly disposed in the chamber and depositing an organic layer on the substrate by moving the substrate or the thin film deposition assembly relative to the other; removing the substrate on which the deposition process is completed, from the chamber by using the first circulation unit; separating the substrate on which the deposition process is completed, from the electrostatic chuck; and fixing the substrate on the electrostatic chuck separated from the substrate by using a second circulation unit installed outside the chamber.

According to another aspect of the present invention, a plurality of thin film deposition assemblies may be disposed in the chamber so that a deposition process is continuously performed on the substrate by using each of the thin film deposition assemblies.

According to another aspect of the present invention, a plurality of thin film deposition assemblies may be disposed in the chamber, and the chamber may include a first chamber and a second chamber connected to each other so that a deposition process is continuously performed on the substrate while the substrate is moved relative to the thin film deposition assembly in the first and second chambers.

The thin film deposition assembly may include: a deposition source that discharges a deposition material; a deposition source nozzle unit that is disposed at a side of the deposition source and includes a plurality of deposition source nozzles arranged in a first direction; and a patterning slit sheet that is disposed opposite to the deposition source nozzle unit and includes a plurality of patterning slits arranged in a second direction that is perpendicular to the first direction, wherein the deposition source, the deposition source nozzle unit, and the patterning slit sheet are integrally formed as one body, and the thin film deposition assembly is disposed to be separated from the substrate so that a deposition process is performed on the substrate while the substrate is moved relative to the thin film deposition assembly in the first direction.

The thin film deposition assembly may include: a deposition source that discharges a deposition material; a deposition source nozzle unit that is disposed at a side of the deposition source and includes a plurality of deposition source nozzles arranged in a first direction; a patterning slit sheet that is disposed opposite to the deposition source nozzle unit and includes a plurality of patterning slits arranged in the first direction; and a barrier wall assembly that is disposed between the deposition source nozzle unit and the patterning slit sheet in the first direction, and includes a plurality of barrier walls that partition a space between the deposition source nozzle unit and the patterning slit sheet into a plurality of sub-deposition spaces, and wherein the thin film deposition assembly is disposed to be separated from the substrate so that a deposition process is performed on the substrate while the thin film deposition assembly or the substrate is moved relative to the other.

The patterning slit sheet may include a first mark, and the substrate may include a second mark, and the thin film deposition assembly may include a camera assembly for capturing a degree of alignment of the first mark and the second mark, and wherein the camera assembly includes: a hood having an opening formed in one end of the hood; a camera installed in the hood; an optical system disposed between the camera and the opening; a protection window disposed between the optical system and the opening; and a heater disposed on the protection window, and wherein the degree of alignment of the first mark and the second mark is detected while the deposition process is performed.

The patterning slit sheet may include a first mark, and the substrate may include a second mark, and the thin film deposition assembly may be driven while the deposition process is performed, so that the first mark and the second mark are aligned with each other.

According to another aspect of the present invention, a thin film deposition apparatus may include: a source chamber which is connected to the chamber and in which the deposition source of the thin film deposition assembly is accommodated; a valve opening or closing a space between the chamber and the source chamber; and a shutter closing the space between the chamber and the source chamber when the deposition source is located at the chamber, and the method further including: conveying the deposition source to the source chamber after the deposition process on the substrate is completed; closing the space between the chamber and the source chamber by using the valve; and replacing the deposition source.

The patterning slit sheet may include a first mark, and the substrate may include a second mark, and the thin film deposition assembly may include a camera assembly for capturing a degree of alignment of the first mark and the second mark, and wherein the camera assembly includes: a hood having an opening formed in one end of the hood; a camera installed in the hood; an optical system disposed between the camera and the opening; a protection window disposed between the optical system and the opening; and a heater disposed on the protection window, and wherein the degree of alignment of the first mark and the second mark is detected while the deposition process is performed.

The patterning slit sheet may include a first mark, and the substrate may include a second mark, and the thin film deposition assembly may be driven while the deposition process is performed, so that the first mark and the second mark are aligned with each other.

According to another aspect of the present invention, a thin film deposition apparatus may include: a source chamber which is connected to the chamber and in which the deposition source of the thin film deposition assembly is accommodated; a valve opening or closing a space between the chamber and the source chamber; and a shutter closing the space between the chamber and the source chamber when the deposition source is located at the chamber, and the method further including: conveying the deposition source to the source chamber after the deposition process on the substrate is completed; closing the space between the chamber and the source chamber by using the valve; and replacing the deposition source.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 17 is a cross-sectional view of an organic light-emitting display apparatus manufactured by using a thin film deposition apparatus, according to an embodiment of the present invention.

DETAILED DESCRIPTION

Figure 1:
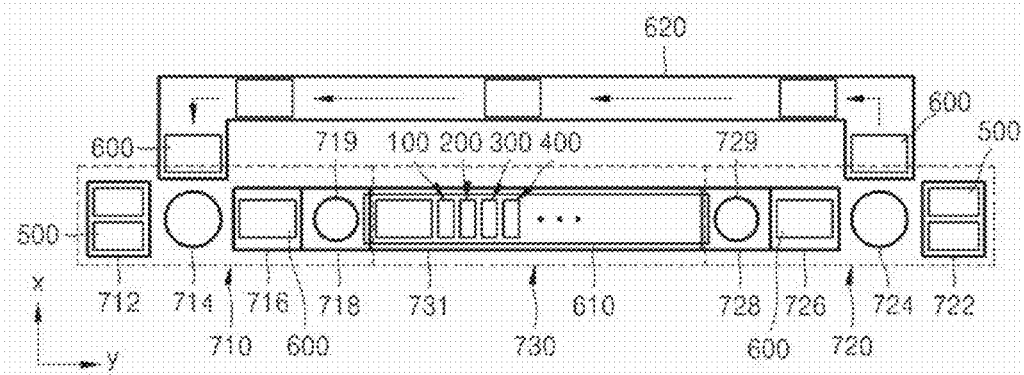
FIG. 1 is a schematic view of a thin film deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

The present invention will now be described more fully with reference to the accompanying drawings, in which exemplary embodiments of the invention are shown.

Here, when a first element is described as being coupled to a second element, the first element may be not be only directly coupled to the second element but may also be indirectly coupled to the second element via a third element. Moreover, it is to be understood that where is stated herein that one film or layer is "formed on" or "disposed on" a second layer or film, the first layer or film may be formed or disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process.

Figure 2:
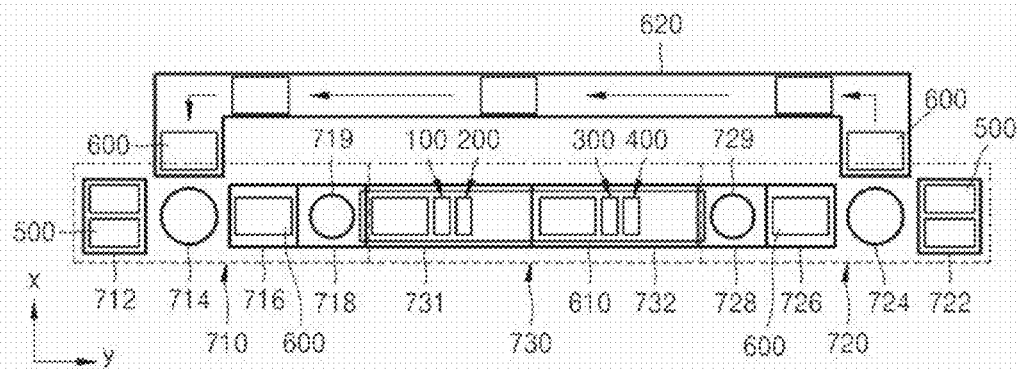
FIG. 2 illustrates a modified example of the thin film deposition apparatus of FIG. 1.
Figure 3:
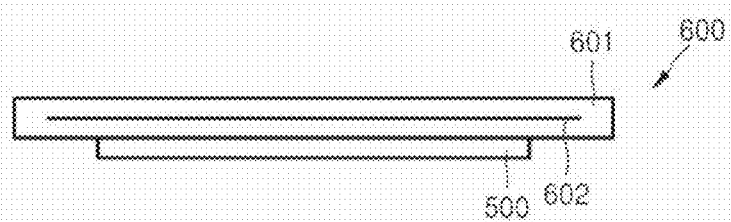
FIG. 3 is a schematic view of an electrostatic chuck, according to an embodiment of the present invention.

FIG. 1 is a schematic view of a thin film deposition apparatus according to an embodiment of the present invention, and FIG. 2 illustrates a modified example of the thin film deposition apparatus of FIG. 1. FIG. 3 is a schematic view of an electrostatic chuck 600, according to an embodiment of the present invention.

Referring to FIG. 1, the thin film deposition apparatus according to an embodiment of the present invention includes a loading unit 710, a deposition unit 730, an unloading unit 720, a first circulation unit 610, and a second circulation unit 620.

The loading unit 710 may include a first rack 712, a transport robot 714, a transport chamber 716, and a first inversion chamber 718.

A plurality of substrates 500 on which deposition is not performed, are stacked on the first rack 712, and the transport robot 714 picks up the substrates 500 from the first rack 712, places the substrates 500 on the electrostatic chuck 600 conveyed from the second circulation unit 620 and then conveys the electrostatic chuck 600 on which the substrates 500 are placed, to the transport chamber 716.

The first inversion chamber 718 is disposed adjacent to the transport chamber 716, and a first inversion robot 719 located at the first inversion chamber 718 inverts the electrostatic chuck 600 to bar the electrostatic chuck 600 on the first circulation unit 610 of the deposition unit 730.

As illustrated in FIG. 3, the electrostatic chuck 600 includes an electrode 602 embedded in a main body 601 formed of dielectric material, wherein the electrode 602 is supplied with power. Such an electrostatic chuck may fix the substrates 500 on a surface of the main body 601 as a high voltage is applied to the electrode 602.

Referring to FIG. 1, the transport robot 714 places the substrates 500 on a top surface of the electrostatic chuck 600. In this state, the electrostatic chuck 600 is conveyed to the transport chamber 716. As the first inversion robot 719 inverts the electrostatic chuck 600, the substrates 500 are directed downwards in the deposition unit 730.

The unloading unit 720 is constituted to operate in an opposite manner to the loading unit 710 described above. In other words, the substrates 500 and the electrostatic chuck 600 that pass through the deposition unit 730 are inverted by a second inversion robot 729 in a second inversion chamber 728 and are conveyed to an ejection chamber 726, and an ejection robot 724 takes the substrates 500 and the electrostatic chuck 600 out of the ejection chamber 726 and then separates the substrates 500 from the electrostatic chuck 600 to place or stack the substrates 500 on a second rack 722. The electrostatic chuck 600 which is separated from the substrates 500 is returned to the loading unit 710 via the second circulation unit 620.

However, aspects of the present invention are not limited thereto. The substrates 500 may be fixed on a bottom surface of the electrostatic chuck 600 from when the substrates 500 are initially fixed on the electrostatic chuck 600, and the electrostatic chuck 600 may be conveyed to the deposition unit 730. In this regard, the first inversion chamber 718, the first inversion robot 719, the second inversion chamber 728, and the second inversion robot 729 are not necessary.

The deposition unit 730 includes at least one deposition chamber. According to the embodiment of FIG. 1, the deposition unit 730 may include a first chamber 731, and a plurality of thin film deposition assemblies 100, 200, 300, and 400 are disposed in the first chamber 731. According to the embodiment of FIG. 1, four thin film deposition assemblies including a first thin film deposition assembly 100, a second thin film deposition assembly 200, a third thin film deposition assembly 300, and a fourth thin film deposition assembly 400 are installed in the first chamber 731. However, the number of thin film deposition assemblies to be installed in the first chamber 731 may vary according to a deposition material and a deposition condition. The first chamber 731 has an appropriate degree of vacuum maintained therein when deposition is performed.

Also, according to another embodiment of the present invention as illustrated in FIG. 2, the deposition unit 730 includes the first chamber 731 and the second chamber 732 connected to each other, and the first and second thin film deposition assemblies 100 and 200 may be disposed in the first chamber 731, and the third and fourth thin film deposition assemblies 300 and 400 may be disposed in the second chamber 732. Of course, the number of chambers is not limited thereto and may be increased.

According to the embodiment of FIG. 1, the electrostatic chuck 600, on which the substrates 500 are disposed, is moved to at least the deposition unit 730 by the first circulation unit 610 and may be sequentially moved to the loading unit 710, the deposition unit 730, and the unloading unit 720. The electrostatic chuck 600 separated from the substrates 500 in the unloading unit 720 is returned to the loading unit 710 by the second circulation unit 620.

The first circulation unit 610 is disposed to pass through the first chamber 731 when passing through the deposition unit 730, and the second circulation unit 620 allows the electrostatic chuck 600 to be conveyed to the loading unit 710.

Figure 4:
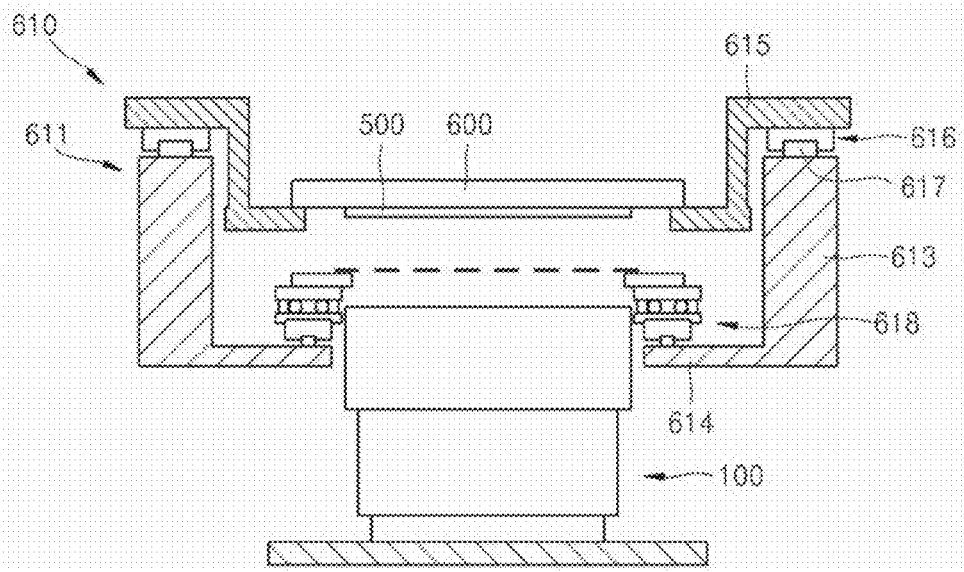
FIG. 4 is a cross-sectional view of a first circulation unit of the thin film deposition apparatus of FIG. 1.

FIG. 4 is a cross-sectional view of the first circulation unit 610 of the thin film deposition apparatus of FIG. 1.

The first circulation unit 610 includes a first carrier 611 that allows the electrostatic chuck 600 on which the substrates 500 are disposed, to be moved.

The first carrier 611 includes a first support 613, a second support 614, a moving bar 615, and a first driving unit 616.

The first support 613 and the second support 614 are installed to pass through a chamber of the deposition unit 730, for example, in the embodiment of FIG. 1, the first chamber 731, and in the embodiment of FIG. 2, the first chamber 731 and the second chamber 732.

The first support 613 is disposed vertically in the first chamber 731, and the second support 614 is horizontally disposed below the first support 613 in the first chamber 731. As illustrated in FIG. 4, the first support 613 and the second support 614 are disposed perpendicular to each other forming a bent structure. However, aspects of the present invention are not limited thereto. The first support 613 may be disposed above the second support 614, and the second support 614 may be disposed below the first support 613.

The moving bar 615 is movable along the first support 613. At least one end of the moving bar 615 is supported by the first support 613, and the other end of the moving bar 615 is formed to be supported by edges of the electrostatic chuck 600. The electrostatic chuck 600 may be fixedly supported on the moving bar 615 and may be moved along the first support 613 due to the moving bar 615. A portion of the moving bar 615 that supports the electrostatic chuck 600 may be bent toward a thin film deposition assembly 100 and may allow the substrates 500 to be close to the thin film deposition assembly 100.

The first driving unit 616 is interposed between the moving bar 615 and the first support 613. The first driving unit 616 may include a roller 617 that may be rolled along the first support 613. The first driving unit 616 allows the moving bar 615 to be moved along the first support 613 and may provide a driving power or may transfer a driving power generated by an additional driving source to the moving bar 615. The first driving unit 616 may be any driving device that allows the moving bar 615 to be moved, as well as the roller 617.

Figure 5:
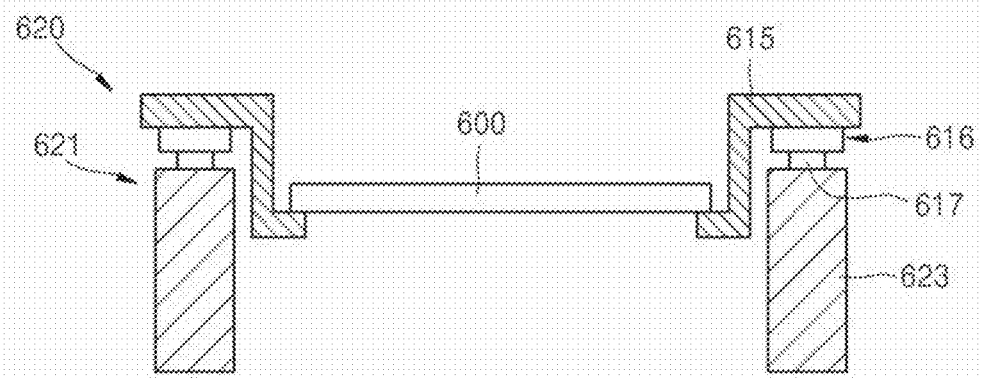
FIG. 5 is a cross-sectional view of a second circulation unit of the thin film deposition apparatus of FIG. 1.

FIG. 5 is a cross-sectional view of the second circulation unit 620 of the thin film deposition apparatus of FIG. 1.

The second circulation unit 620 includes a second carrier 621 that allows the electrostatic chuck 600 that is separated from the substrates 500 to be moved.

The second carrier 621 includes a third support 623, the moving bar 615, and the first driving unit 616.

The third support 623 extends to the same length as an extended length of the first support 613 of the first carrier 611. The moving bar 615 on which the first driving unit 616 is disposed is supported by the third support 623, and the electrostatic chuck 600 that is separated from the substrates 500 is mounted on the moving bar 615. Structures of the moving bar 615 and the first driving unit 616 are as described above.

Figure 6:
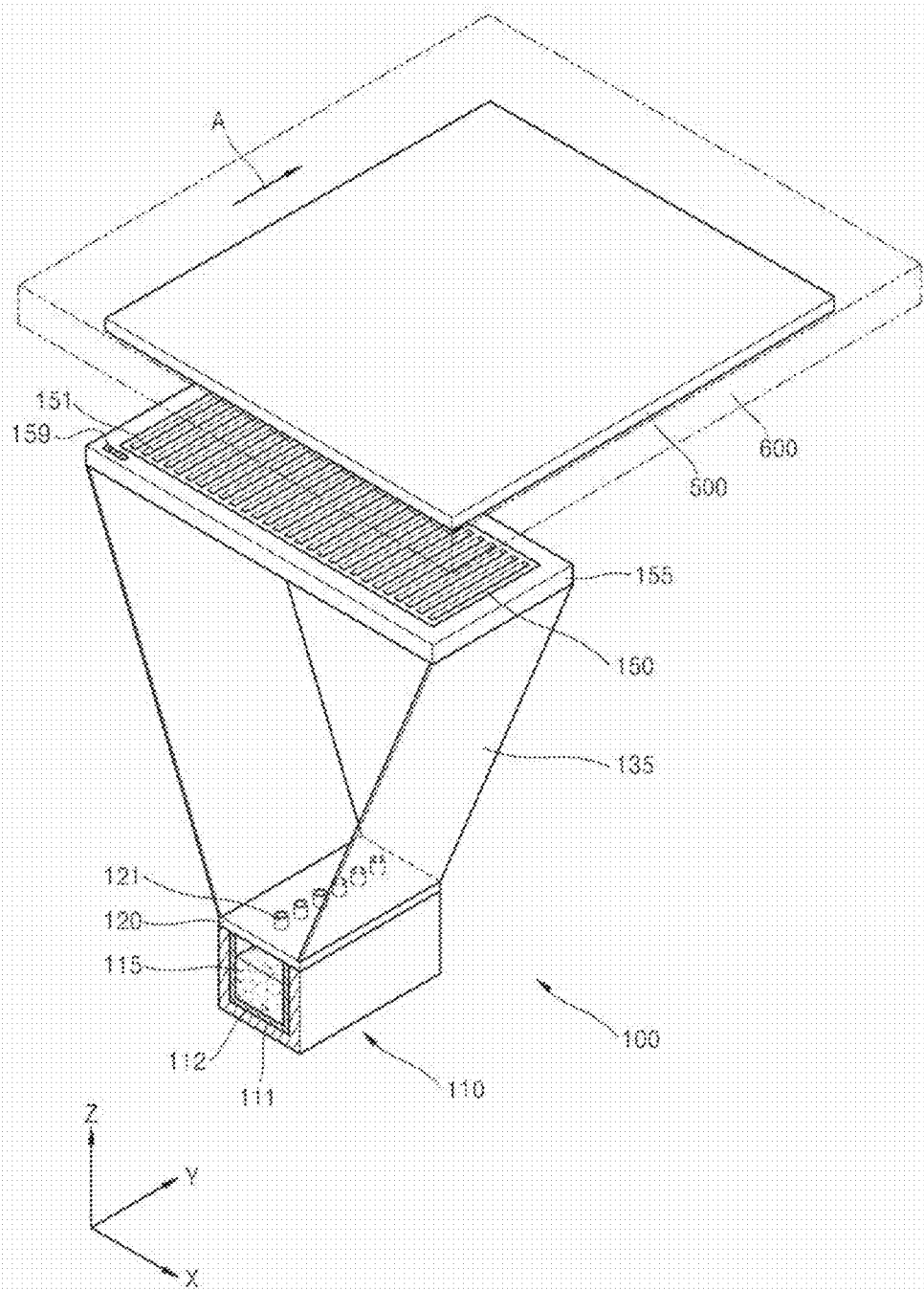
FIG. 6 is a perspective view of a thin film deposition assembly according to an embodiment of the present invention.

Next, the thin film deposition assembly 100 disposed in the first chamber 731 will be described. FIG. 6 is a perspective view of the thin film deposition assembly 100 according to an embodiment of the present invention, FIG. 7 is a schematic cross-sectional side view of the thin film deposition assembly 100 of FIG. 6, according to an embodiment of the present invention, and FIG. 8 is a schematic plan view of the thin film deposition assembly 100 of FIG. 6, according to an embodiment of the present invention.

Figure 7:
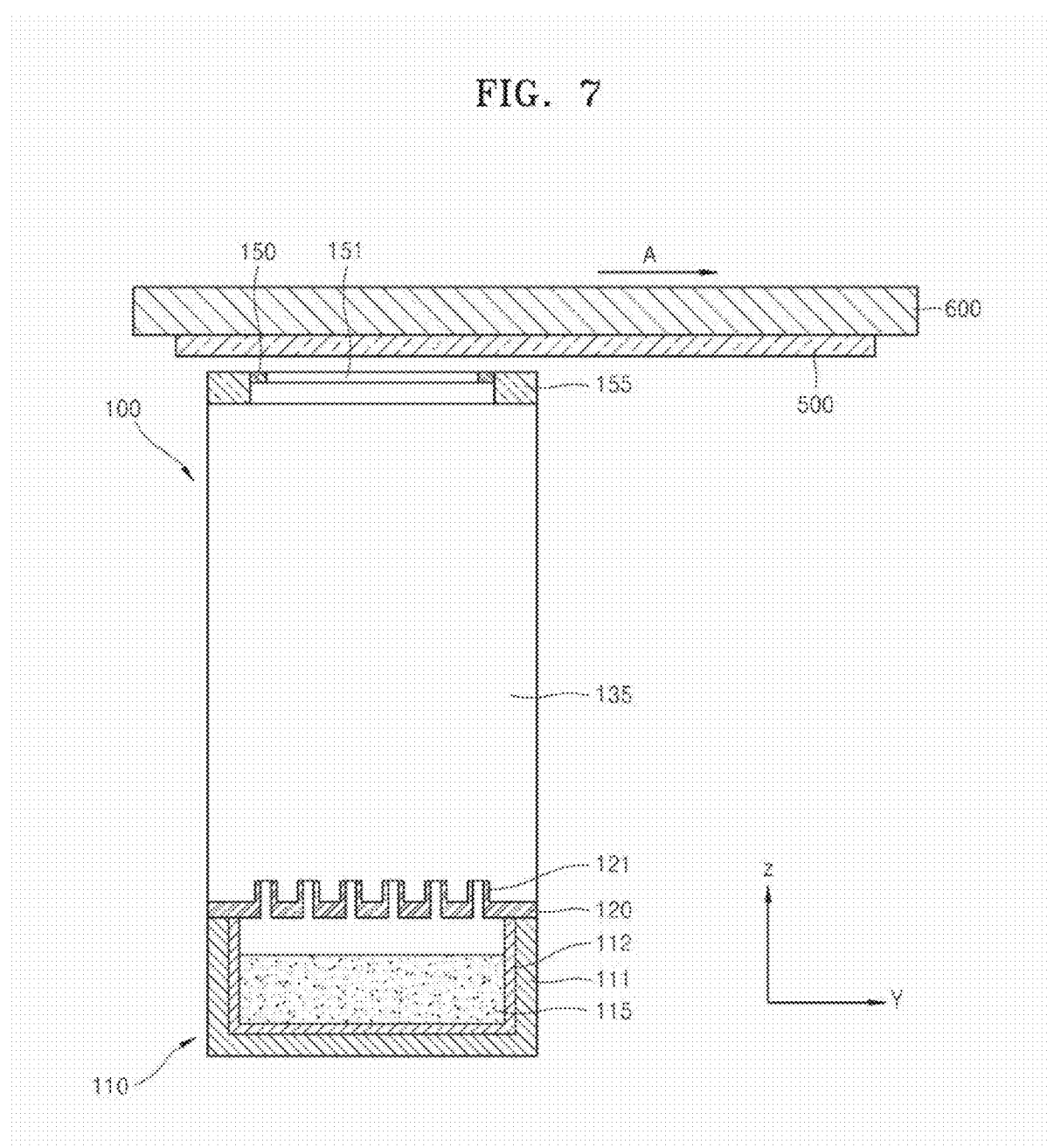
FIG. 7 is a schematic cross-sectional side view of the thin film deposition assembly of FIG. 6, according to an embodiment of the present invention.
Figure 8:
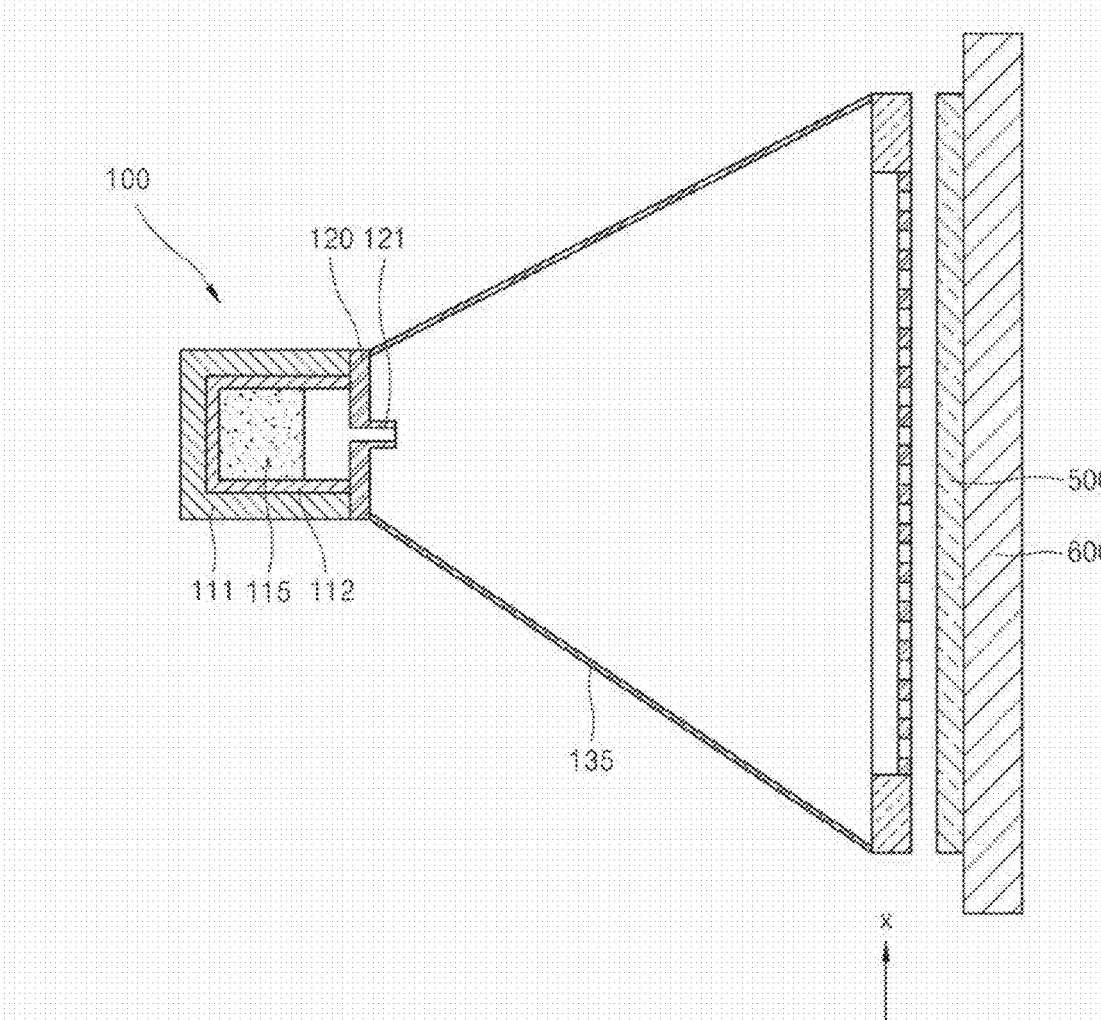
FIG. 8 is a schematic plan view of the thin film deposition assembly of FIG. 6, according to an embodiment of the present invention.

Referring to FIGS. 6 through 8, the thin film deposition assembly 100 includes a deposition source 110, a deposition source nozzle unit 120, and a patterning slit sheet 150.

In particular, in order to deposit a deposition material 115 emitted from the deposition source 110 and discharged through the deposition source nozzle unit 120 and the patterning slit sheet 150, onto a substrate 500 in a desired pattern, the first chamber 731 should be maintained in a high-vacuum state as in a deposition method using a fine metal mask (FMM). In addition, the temperature of the patterning slit sheet 150 should be sufficiently lower than the temperature of the deposition source 110. In this regard, the temperature of the patterning slit sheet 150 may be about 100° C. or less. The temperature of the patterning slit sheet 150 should be sufficiently low so as to reduce thermal expansion of the patterning slit sheet 150.

The substrate 500, which constitutes a deposition target on which the deposition material 115 is to be deposited, is disposed in the first chamber 731. The substrate 500 may be a substrate for flat panel displays. A large substrate, such as a mother glass, for manufacturing a plurality of flat panel displays, may be used as the substrate 500. Other substrates may also be employed.

Deposition may be performed while the substrate 500 or the thin film deposition assembly 100 is moved relative to the other.

In particular, in the conventional FMM deposition method, the size of the FMM has to be equal to the size of a substrate. Thus, the size of the FMM has to be increased as the substrate becomes larger. However, it is neither simple to manufacture a large FMM nor to extend an FMM to be accurately aligned with a pattern.

In order to overcome this problem, in the thin film deposition assembly 100 according to an embodiment of the present invention, deposition may be performed while the thin film deposition assembly 100 or the substrate 500 is moved relative to the other. In other words, deposition may be continuously performed while the substrate 500, which is disposed to face the thin film deposition assembly 100, is moved in a Y-axis direction. In other words, deposition is performed in a scanning manner while the substrate 500 is moved in a direction of arrow A in FIG. 6.

In the thin film deposition assembly 100, the patterning slit sheet 150 may be significantly smaller than an FMM used in a conventional deposition method. In other words, in the thin film deposition assembly 100, deposition is continuously performed, i.e., in a scanning manner while the substrate 500 is moved in the Y-axis direction. Thus, lengths of the patterning slit sheet 150 in the X-axis and Y-axis directions may be significantly less than the lengths of the substrate 500 in the X-axis and Y-axis directions. As described above, since the patterning slit sheet 150 may be formed to be significantly smaller than an FMM used in the conventional deposition method, it is relatively easy to manufacture the patterning slit sheet 150 used in the aspects of the present invention. In other words, using the patterning slit sheet 150, which is smaller than an FMM used in the conventional deposition method, is more convenient in all processes, including etching and other subsequent processes, such as precise extension, welding, moving, and cleaning processes, compared to the conventional deposition method using the larger FMM. This is more advantageous for a relatively large display apparatus.

The deposition source 110 that contains and heats the deposition material 115 is disposed in an opposite side of the first chamber 731 to the side in which the substrate 500 is disposed. While the deposition material 115 contained in the deposition source 110 is vaporized, the deposition material 115 is deposited on the substrate 500.

In particular, the deposition source 110 includes a crucible 112 that is filled with the deposition material 115, and a cooling block 111 that includes a heater (not shown) that heats the crucible 112 to vaporize the deposition material 115, which is contained in the crucible 112, towards a side of the crucible 112, and in particular, towards the deposition source nozzle unit 120. The cooling block 111 prevents radiation of heat from the crucible 112 to outside, i.e., into the first chamber 731.

The deposition source nozzle unit 120 is disposed at a side of the deposition source 110, and in particular, at the side of the deposition source 110 facing the substrate 500. The deposition source nozzle unit 120 includes a plurality of deposition source nozzles 121 arranged at equal intervals in the Y-axis direction, i.e., a scanning direction of the substrate 500. The deposition material 110 that is vaporized in the deposition source 110 passes through the deposition source nozzle unit 120 towards the substrate 500. As described above, when the deposition source nozzle unit 120 includes the plurality of deposition source nozzles 121 arranged in the Y-axis direction, that is, the scanning direction of the substrate 500, the size of a pattern formed of the deposition material 115 discharged through the patterning slits 151 of the patterning slit sheet 150 is affected by the size of each deposition source nozzle 121 (since there is only one line of deposition nozzles in the X-axis direction), and thus no shadow zone may be formed on the substrate 500. In addition, since the plurality of deposition source nozzles 121 are arranged in the scanning direction of the substrate 500, even when there is a difference in flux between the deposition source nozzles 121, the difference may be compensated for and deposition uniformity may be maintained constant.

The patterning slit sheet 150 and a frame 155 in which the patterning slit sheet 150 is bound are disposed between the deposition source 110 and the substrate 500. The frame 155 may be formed in a lattice shape, similar to a window frame. The patterning slit sheet 150 is bound inside the frame 155. The patterning slit sheet 150 includes a plurality of patterning slits 151 arranged in the X-axis direction. The deposition material 115 that is vaporized in the deposition source 110, passes through the deposition source nozzle unit 120 and the patterning slit sheet 150 towards the substrate 500. The patterning slit sheet 150 may be manufactured by etching, which is the same method as used in a conventional method of manufacturing an FMM, and in particular, a striped FMM. In this regard, the total number of patterning slits 151 may be greater than the total number of deposition source nozzles 121.

In addition, the deposition source 110 and the deposition source nozzle unit 120 coupled to the deposition source 110 may be disposed to be separated from the patterning slit sheet 150 by a predetermined distance. Alternatively, the deposition source 110 and the deposition source nozzle unit 120 coupled to the deposition source 110 may be connected to the patterning slit sheet 150 by a first connection member 135. That is, the deposition source 110, the deposition source nozzle unit 120, and the patterning slit sheet 150 may be integrally formed as one body by being connected to each other via the first connection member 135. The first connection member 135 guides the deposition material 121, which is discharged through the deposition source nozzles 121, to move in a substantially straight line through the thin film deposition assembly 100, and not to flow in the X-axis direction. In FIG. 6, the first connection members 135 are formed on left and right sides of the deposition source 110, the deposition source nozzle unit 120, and the patterning slit sheet 150 to guide the deposition material 915 not to flow in the X-axis direction; however, aspects of the present invention are not limited thereto. That is, the first connection member 135 may be formed as a sealed box to guide the flow of the deposition material 915 both in the X-axis and Y-axis directions.

As described above, the thin film deposition assembly 100 performs deposition while being moved relative to the substrate 500. In order to move the thin film deposition assembly 100 relative to the substrate 500, the patterning slit sheet 150 is separated from the substrate 500 by a predetermined distance.

In particular, in the conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display apparatuses become larger. However, it is not easy to manufacture such a large mask.

In order to overcome this problem, in the thin film deposition assembly 100, the patterning slit sheet 150 is disposed to be separated from the substrate 500 by a predetermined distance.

As described above, a mask is formed to be smaller than a substrate, and deposition is performed while the mask is moved relative to the substrate. Thus, the mask can be easily manufactured. In addition, defects caused due to the contact between a substrate and an FMM, which occur in the conventional deposition method, may be prevented. Furthermore, since it is unnecessary to dispose the FMM in close contact with the substrate during a deposition process, the manufacturing time may be reduced.

Figure 9:
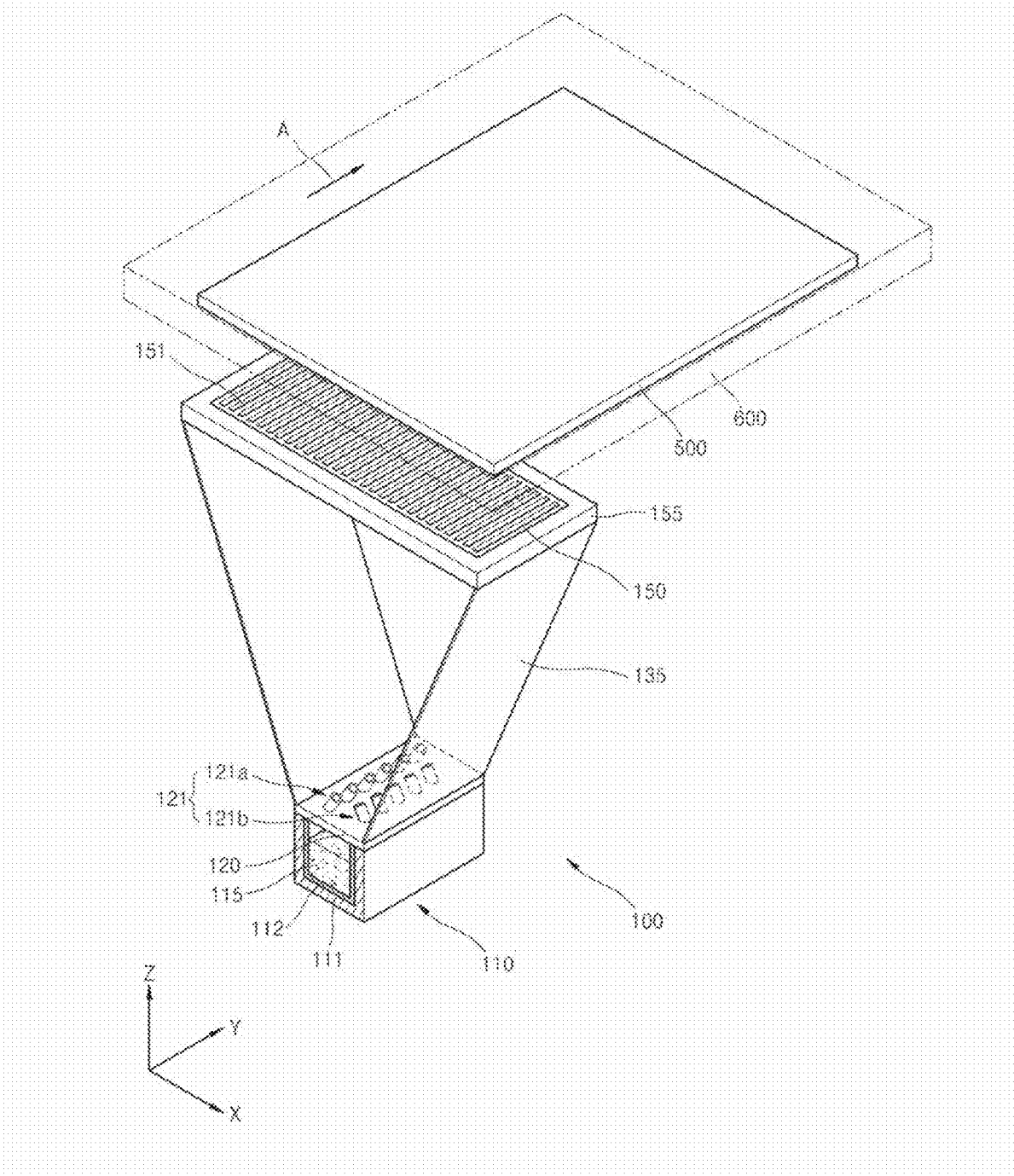
FIG. 9 is a perspective view of a thin film deposition assembly according to another embodiment of the present invention.

FIG. 9 is a perspective view of a thin film deposition assembly 100 according to another embodiment of the present invention. Referring to FIG. 9, the thin film deposition assembly 100 includes a deposition source 110, a deposition source nozzle unit 120, and a patterning slit sheet 150. In particular, the deposition source 110 includes a crucible 112 that is filled with a deposition material 115, and a cooling block 111 that includes a heater (not shown) that heats the crucible 112 to vaporize the deposition material 115, so as to move the vaporized deposition material 115 to the deposition source nozzle unit 120. The cooling block 111 is contained in the crucible 112. The deposition source nozzle unit 120, which has a planar shape, is disposed at a side of the deposition source 110. The deposition source nozzle unit 120 includes a plurality of deposition source nozzles 121 arranged in the Y-axis direction. The patterning slit sheet 150 and a frame 155 are further disposed between the deposition source 110 and the substrate 500. The patterning slit sheet 150 includes a plurality of patterning slits 151 arranged in the X-axis direction. In addition, the deposition source 110 and the deposition source nozzle unit 120 may be connected to the patterning slit sheet 150 by a second connection member 133 (illustrated in FIG. 11).

A plurality of deposition source nozzles 121 formed on the deposition source nozzle unit 120 are tilted at a predetermined angle, unlike the thin film deposition assembly 100 described with reference to FIG. 6. In particular, the deposition source nozzles 121 may include deposition source nozzles 121a and 121b arranged in respective rows. The deposition source nozzles 121a and 121b may be arranged in respective rows to alternate in a zigzag pattern. The deposition source nozzles 121a and 121b may be tilted at a predetermined angle on an XZ plane.

The deposition source nozzles 121a and 121b are arranged to be tilted at a predetermined angle to each other. The deposition source nozzles 121a in a first row and the deposition source nozzles 121b in a second row may be tilted to face each other. That is, the deposition source nozzles 121a of the first row in a left part of the deposition source nozzle unit 121 may be tilted to face a right side portion of the patterning slit sheet 150, and the deposition source nozzles 121b of the second row in a right part of the deposition source nozzle unit 121 may be tilted to face a left side portion of the patterning slit sheet 150.

Due to the structure of the thin film deposition assembly 100 according to the current embodiment, the deposition of the deposition material 115 may be adjusted to lessen a thickness variation between the center and the end portions of the substrate 500 and improve thickness uniformity of the deposition film. Moreover, utilization efficiency of the deposition material 115 may also be improved.

Figure 10:
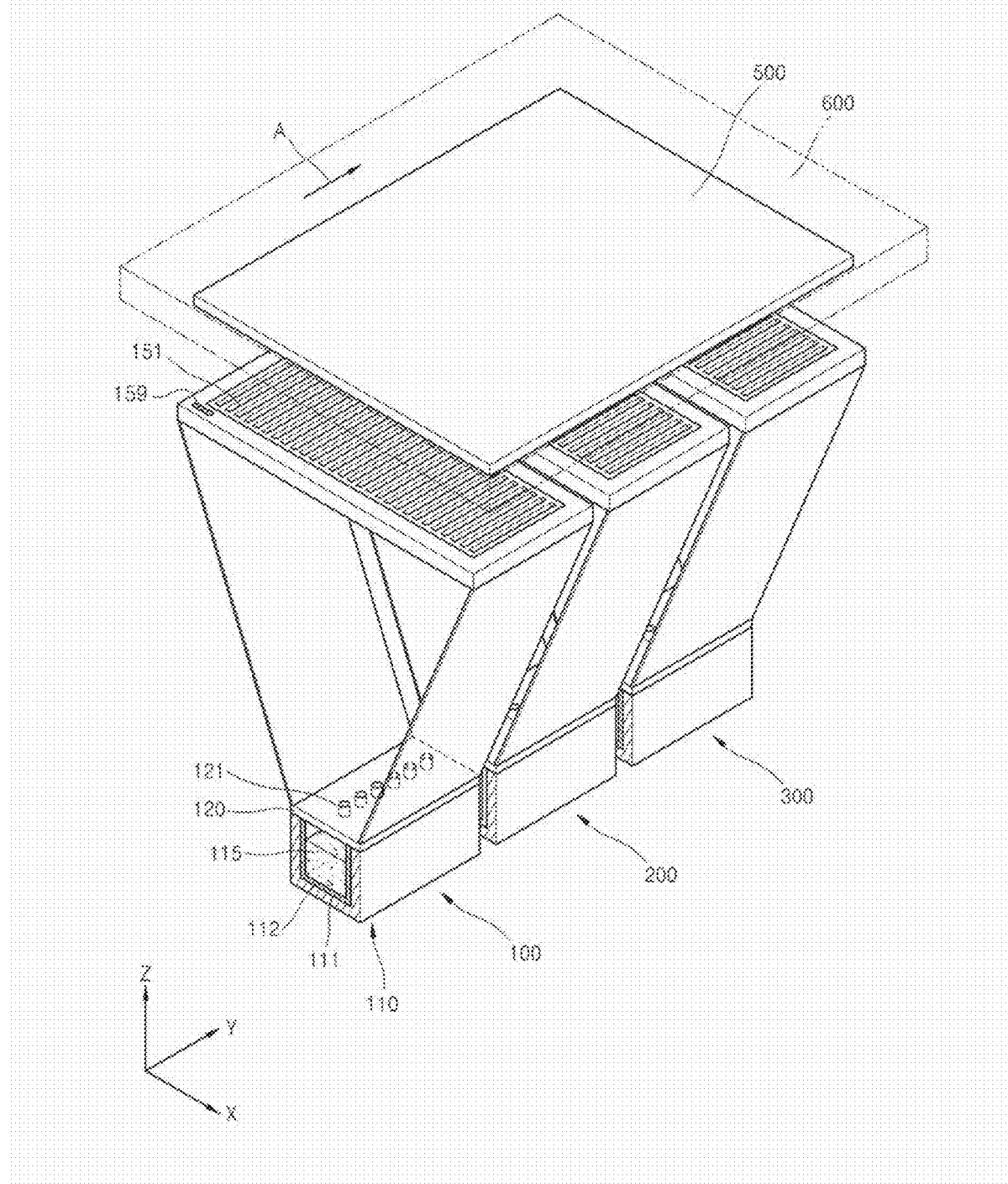
FIG. 10 is a perspective view of a thin film deposition assembly according to another embodiment of the present invention.

FIG. 10 is a perspective view of a thin film deposition assembly according to another embodiment of the present invention. Referring to FIG. 10, the thin film deposition apparatus includes a plurality of thin film deposition assemblies, each of which has the structure of the thin film deposition apparatus 100 illustrated in FIGS. 6 through 8. In other words, the thin film deposition apparatus illustrated in FIG. 10 may include a multi-deposition source that simultaneously discharges deposition materials for forming a red (R) emission layer, a green (G) emission layer, and a blue (B) emission layer.

In particular, the thin film deposition apparatus includes a first thin film deposition assembly 100, a second thin film deposition assembly 200, and a third thin film deposition assembly 300. Each of the first thin film deposition assembly 100, the second thin film deposition assembly 200, and the third thin film deposition assembly 300 has the same structure as the thin film deposition assembly 100 described with reference to FIGS. 6 through 8, and thus a detailed description thereof will not be provided here.

The deposition sources 110 of the first thin film deposition assembly 100, the second thin film deposition assembly 200 and the third thin film deposition assembly 300 may contain different deposition materials, respectively. The first thin film deposition assembly 100 may contain a deposition material for forming the R emission layer, the second thin film deposition assembly 200 may contain a deposition material for forming the G emission layer, and the third thin film deposition assembly 300 may contain a deposition material for forming the B emission layer.

In other words, in a conventional method of manufacturing an organic light-emitting display apparatus, a separate chamber and mask are used to form each color emission layer. However, when the thin film deposition apparatus according to an embodiment of the present invention is used, the R emission layer, the G emission layer and the B emission layer may be formed at the same time with a single multi-deposition source. Thus, the time it takes to manufacture the organic light-emitting display apparatus is significantly reduced. In addition, the organic light-emitting display apparatus may be manufactured with a reduced number of chambers, so that equipment costs are also markedly reduced.

Although not illustrated, a patterning slit sheet of the first thin film deposition assembly 100, a patterning slit sheet of the second thin film deposition assembly 200, a patterning slit sheet of the third thin film deposition assembly 300 may be arranged to be offset by a constant distance with respect to each other, in order for deposition regions corresponding to the patterning slit sheets not to overlap on the substrate 500. In other words, when the first thin film deposition assembly 100, the second thin film deposition assembly 200, and the third thin film deposition assembly 300 are used to deposit an R emission layer, a G emission layer and a B emission layer, respectively, patterning slits of the first thin film deposition assembly 100, patterning slits of the second thin film deposition assembly 200, and patterning slits of the second thin film deposition assembly 300 are arranged not to be aligned with each other, in order to form the R emission layer, the G emission layer and the B emission layer in different regions of the substrate 500.

In addition, the deposition materials for forming the R emission layer, the G emission layer, and the B emission layer may have different deposition temperatures. Therefore, the temperatures of the deposition sources of the respective first, second, and third thin film deposition assemblies 100, 200, and 300 may be set to be different.

Although the thin film deposition apparatus illustrated in FIG. 10 according to a embodiment of the present invention includes three thin film deposition assemblies, the present invention is not limited thereto. In other words, a thin film deposition apparatus according to another embodiment of the present invention may include a plurality of thin film deposition assemblies, each of which contains a different deposition material. For example, a thin film deposition apparatus according to another embodiment of the present invention may include five thin film deposition assemblies respectively containing materials for a R emission layer, a G emission layer, a B emission layer, an auxiliary layer (R') of the R emission layer, and an auxiliary layer (G') of the G emission layer.

As described above, a plurality of thin layers may be formed at the same time with a plurality of thin film deposition assemblies, and thus manufacturing yield and deposition efficiency are improved. In addition, the overall manufacturing process is simplified, and the manufacturing costs are reduced.

Figure 11:
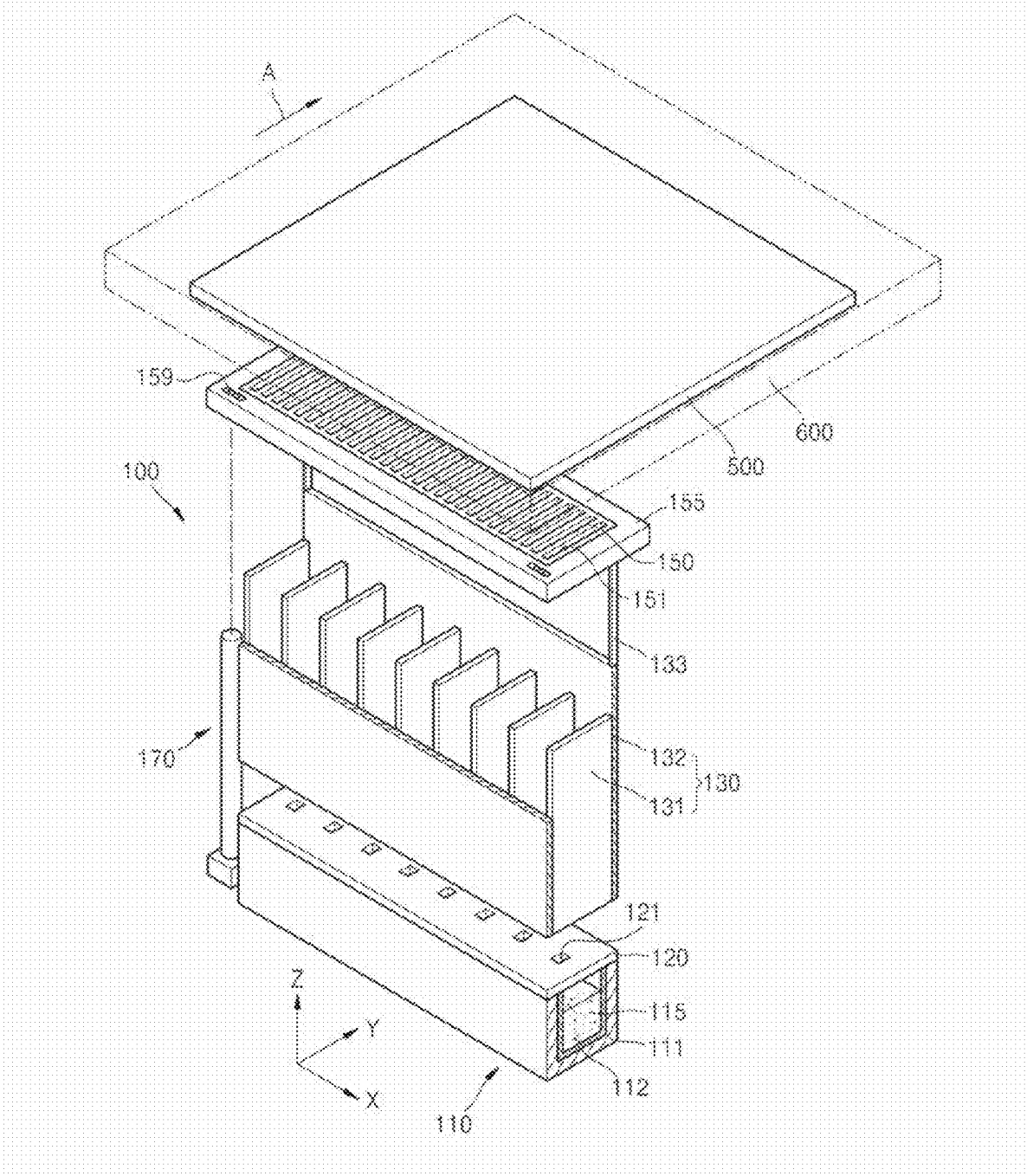
FIG. 11 is a perspective view of a thin film deposition assembly according to another embodiment of the present invention.
Figure 12:
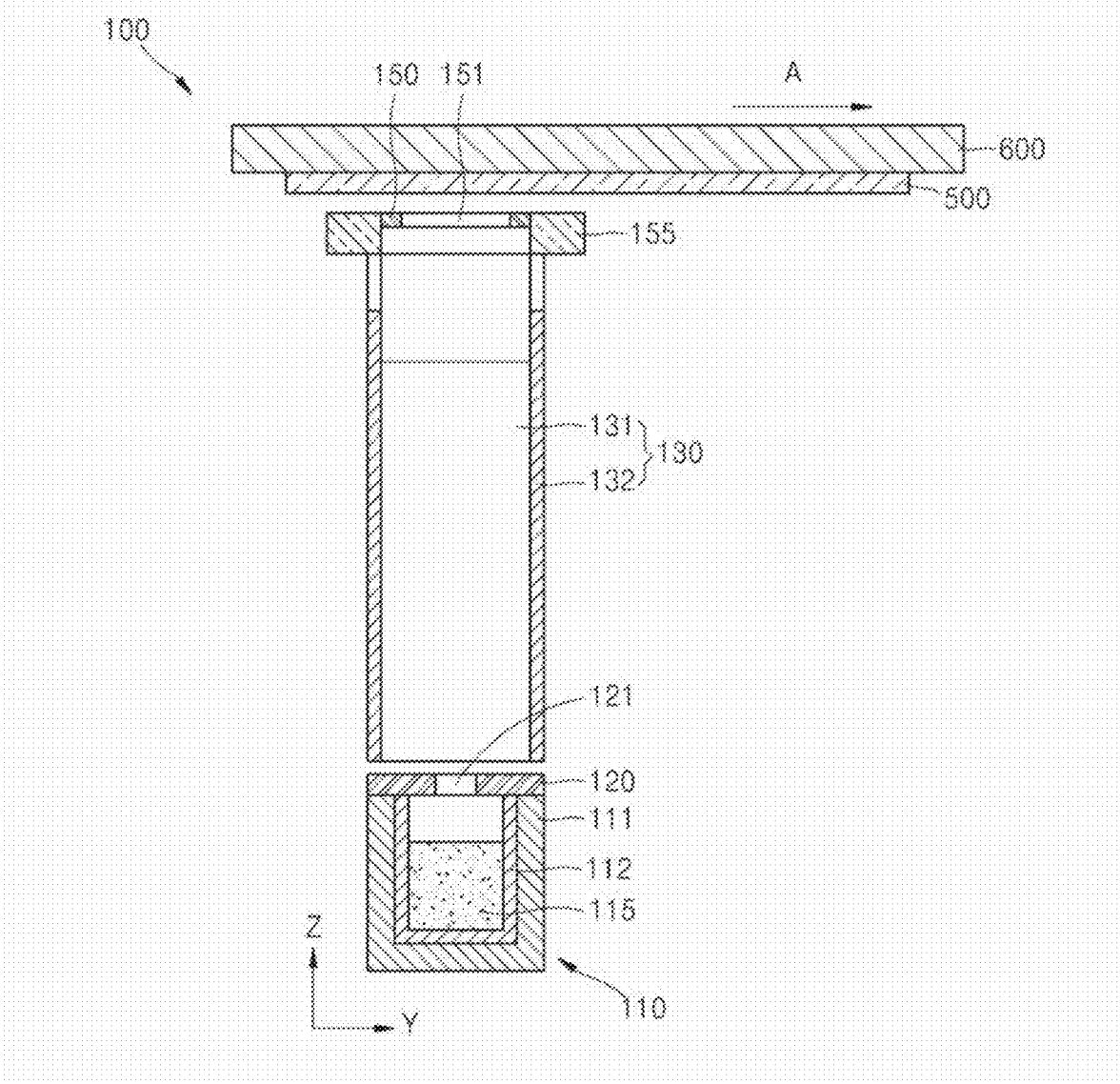
FIG. 12 is a schematic cross-sectional side view of the thin film deposition assembly of FIG. 11, according to an embodiment of the present invention.
Figure 13:
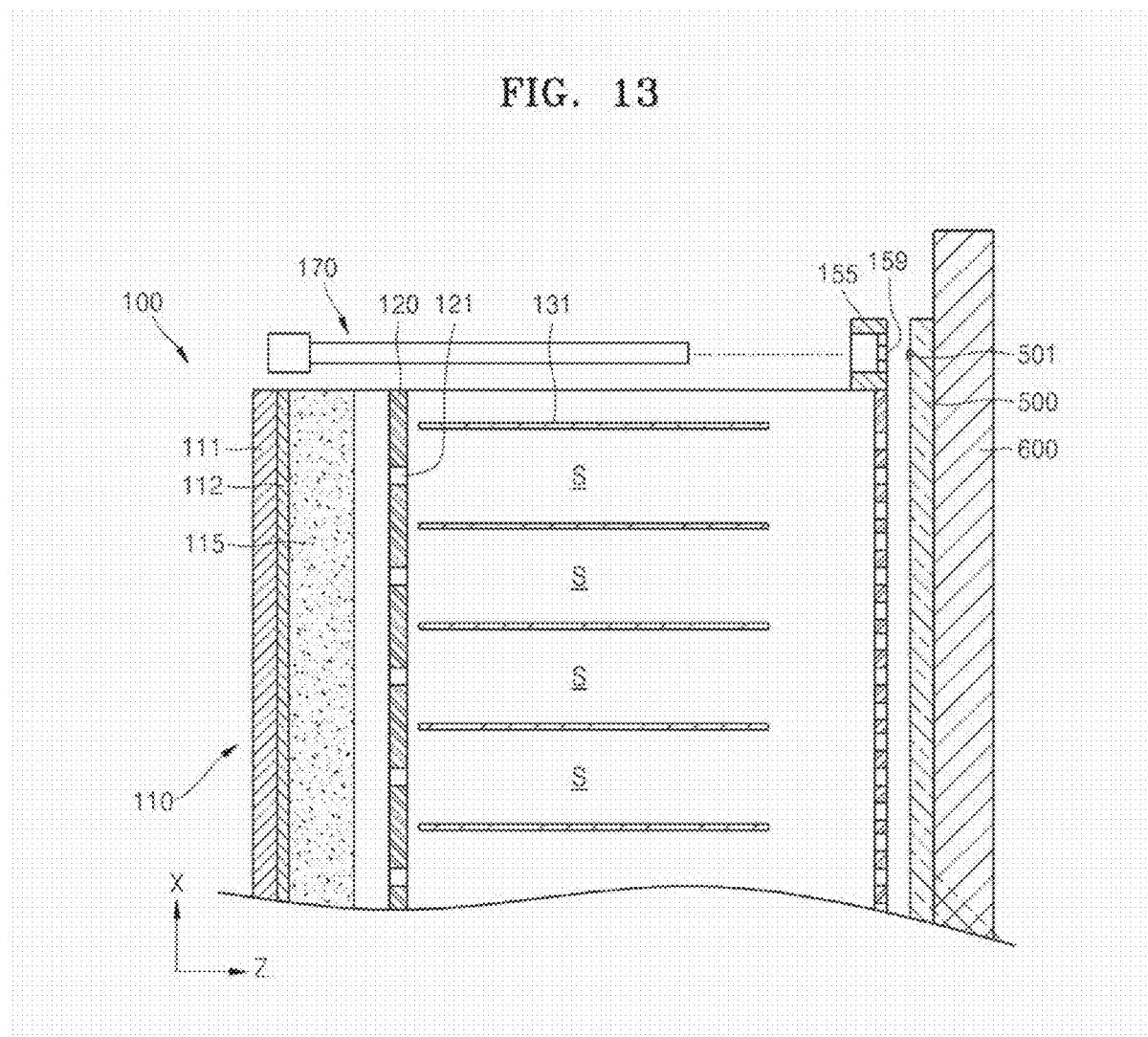
FIG. 13 is a schematic plan view of the thin film deposition assembly of FIG. 11, according to an embodiment of the present invention.

FIG. 11 is a perspective view of a thin film deposition assembly 100 according to another embodiment of the present invention, FIG. 12 is a schematic cross-sectional side view of the thin film deposition assembly 100 of FIG. 11, according to an embodiment of the present invention, and FIG. 13 is a schematic plan view of the thin film deposition assembly 100 of FIG. 11, according to an embodiment of the present invention.

Referring to FIGS. 11 through 13, the thin film deposition assembly 100 includes a deposition source 110, a deposition source nozzle unit 120, a barrier wall assembly 130, and patterning slits 151.

Although a chamber is not illustrated in FIGS. 11 through 13 for convenience of explanation, all the components of the thin film deposition assembly 100 may be disposed within a chamber that has an appropriate degree of vacuum maintained therein. The chamber has an appropriate vacuum maintained therein in order to allow a deposition material to move in a substantially straight line through the thin film deposition assembly 100.

The substrate 500, which constitutes a target on which a deposition material 115 is to be deposited, is conveyed into the chamber by using the electrostatic chuck 600. The substrate 500 may be a substrate for flat panel displays. A large substrate, such as a mother glass, for manufacturing a plurality of flat panel displays, may be used as the substrate 500.

Deposition may be performed while the substrate 500 or the thin film deposition assembly 100 is moved relative to the other. The substrate 500 may be moved relative to the thin film deposition assembly 100 in a direction A.

Like in the above-described embodiment of FIG. 6, in the thin film deposition assembly 100 according to the current embodiment of the present invention, the patterning slit sheet 150 may be significantly smaller than a FMM used in the conventional deposition method. In other words, in the thin film deposition assembly 100, deposition is continuously performed, i.e., in a scanning manner while the substrate 500 is moved in the Y-axis direction. Thus, if a width of the patterning slit sheet 150 in the X-axis direction is substantially the same as a width of the substrate 500 in the X-axis direction, a length of the patterning slit sheet 150 in the Y-axis direction may be significantly less than a length of the substrate 500 in the Y-axis direction. Of course, even when the width of the patterning slit sheet 150 in the X-axis direction is less than the width of the substrate 500 in the X-axis direction, deposition may be sufficiently performed on the entire surface of the substrate 500 in a scanning manner due to relative movement of the substrate 500 and the thin film deposition assembly 100.

As described above, since the patterning slit sheet 150 may be formed to be significantly smaller than an FMM used in the conventional deposition method, it is relatively easy to manufacture the patterning slit sheet 150 used in an aspect of the present invention. In other words, using the patterning slit sheet 150, which is smaller than an FMM used in the conventional deposition method, is more convenient in all processes, including etching and subsequent other processes, such as precise extension, welding, moving, and cleaning processes, compared to the conventional deposition method using the larger FMM. This is more advantageous for a relatively large display apparatus.

The deposition source 110 that contains and heats the deposition material 115 is disposed in an opposite side of the chamber to the side in which the substrate 500 is disposed.

The deposition source 110 includes a crucible 112 that is filled with the deposition material 115, and a cooling block 111 that surrounds the crucible 112. The cooling block 111 prevents radiation of heat from the crucible 112 to outside, i.e., into the chamber. The cooling block 111 may include a heater (not shown) that heats the crucible 112.

The deposition source nozzle unit 120 is disposed at a side of the deposition source 110, and in particular, at the side of the deposition source 110 facing the substrate 500. The deposition source nozzle unit 120 includes a plurality of deposition source nozzles 121 arranged in the X-axis direction. The deposition material 115 that is vaporized in the deposition source 110 passes through the plurality of deposition source nozzles 121 of the deposition source nozzle unit 120 towards the substrate 500.

The barrier wall assembly 130 is disposed at a side of the deposition source nozzle unit 120. The barrier wall assembly 130 includes a plurality of barrier walls 131, and a barrier wall frame 132 that constitutes an outer wall of the barrier walls 131. The plurality of barrier walls 131 may be arranged parallel to each other at equal intervals in the X-axis direction. In addition, each of the barrier walls 131 may be formed to extend in an YZ plane in FIG. 11, i.e., perpendicular to the X-axis direction. The plurality of barrier walls 131 arranged as described above partition the space between the deposition source nozzle unit 120 and the patterning slit sheet 150 into a plurality of sub-deposition spaces S (illustrated in FIG. 13). In the thin film deposition assembly 100, the deposition space is divided by the barrier walls 131 into the sub-deposition spaces S that respectively correspond to the deposition source nozzles 121 through which the deposition material 115 is discharged, as illustrated in FIG. 13.

The barrier walls 131 may be respectively disposed between adjacent deposition source nozzles 121. In other words, each of the deposition source nozzles 121 may be disposed between two adjacent barrier walls 131. The deposition source nozzles 121 may be respectively located at the midpoint between two adjacent barrier walls 131. However, aspects of the present invention are not limited thereto, and the deposition source nozzles 121 may be disposed otherwise. The plurality of deposition source nozzles 121 may be disposed between two adjacent barrier walls 131. Even in this case, the deposition source nozzles 121 may be respectively located at the midpoint between two adjacent barrier walls 131.

As described above, since the barrier walls 131 partition the space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles 121, and passes through patterning slits 151 so as to be deposited on the substrate 500. In other words, the barrier walls 131 guide the deposition material 115, which is discharged through the deposition source nozzles 121, to move in a substantially straight line through the thin film deposition assembly 100, and not to flow in the Z-axis direction.

As described above, the deposition material 115 is forced to move in a substantially straight line through the thin film deposition assembly 100 by installing the barrier walls 131, so that a smaller shadow zone may be formed on the substrate 500 compared to a case where no barrier walls are installed. Thus, the thin film deposition assembly 100 and the substrate 500 can be separated from each other by a predetermined distance. This will be described later in detail.

The barrier wall frame 132, which forms upper and lower sides of the barrier walls 131, maintains the positions of the barrier walls 131, and guides the deposition material 115, which is discharged through the deposition source nozzles 121, to move in a substantially straight line through the thin film deposition assembly 100, and not to flow in the Y-axis direction.

The deposition source nozzle unit 120 and the barrier wall assembly 130 may be separated from each other by a predetermined distance. Thus, heat dissipated from the deposition source 110 may be prevented from being conducted to the barrier wall assembly 130. However, aspects of the present invention are not limited thereto. In other words, when an appropriate insulation unit is disposed between the deposition source nozzle unit 120 and the barrier wall assembly 130, the deposition source nozzle unit 120 and the barrier wall assembly 130 may be combined with each other and may contact each other.

In addition, the barrier wall assembly 130 may be constructed to be detachable from the thin film deposition assembly 100. In order to overcome these problems, in the thin film deposition assembly 100, the deposition space is enclosed by using the barrier wall assembly 130, so that the deposition material 115 that remains undeposited is mostly deposited within the barrier wall assembly 130. Thus, since the barrier wall assembly 130 is constructed to be detachable from the thin film deposition assembly 100, when a large amount of the deposition material 115 lies in the barrier wall assembly 130 after a long deposition process, the barrier wall assembly 130 may be detached from the thin film deposition assembly 100 and then placed in a separate deposition material recycling apparatus in order to recover the deposition material 115. Due to the structure of the thin film deposition assembly 100 according to the present embodiment, a reuse rate of the deposition material 115 is increased, so that the deposition efficiency is improved, and thus the manufacturing costs are reduced.

The patterning slit sheet 150 and a frame 155 in which the patterning slit sheet 150 is bound are disposed between the deposition source 110 and the substrate 500. The frame 155 may be formed in a lattice shape, similar to a window frame. The patterning slit sheet 150 is bound inside the frame 155. The patterning slit sheet 150 includes a plurality of patterning slits 151 arranged in the X-axis direction. The patterning slit sheet 150 extends in the Y-axis direction. The deposition material 115 that is vaporized in the deposition source 110 and passes through the deposition source nozzles 121, passes through the patterning slits 151 towards the substrate 500.

The patterning slit sheet 150 is formed of a metal sheet and is bound on the frame 155 in an extended state. The patterning slits 151 are formed as striped slits in the patterning slit sheet 150 manufactured by etching.

In the thin film deposition assembly 100, the total number of patterning slits 151 may be greater than the total number of deposition source nozzles 121. In addition, there may be a greater number of patterning slits 151 than deposition source nozzles 121 disposed between two adjacent barrier walls 131. The number of the patterning slits 151 may correspond to the number of deposition patterns to be formed on the substrate 500.

In addition, the barrier wall assembly 130 and the patterning slit sheet 150 may be formed to be separated from each other by a predetermined distance. Alternatively, the barrier wall assembly 130 and the patterning slit sheet 150 may be connected by a separate second connection member 133. The temperature of the barrier wall assembly 130 may increase to 100° C. or higher due to the deposition source 110 whose temperature is high. Thus, in order to prevent the heat of the barrier wall assembly 130 from being conducted to the patterning slit sheet 150, the barrier wall assembly 130 and the patterning slit sheet 150 are separated from each other by a predetermined distance.

As described above, the thin film deposition assembly 100 performs deposition while being moved relative to the substrate 500. In order to move the thin film deposition assembly 100 relative to the substrate 500, the patterning slit sheet 150 is separated from the substrate 500 by a predetermined distance. In addition, in order to prevent the formation of a relatively large shadow zone on the substrate 500 when the patterning slit sheet 150 and the substrate 500 are separated from each other, the barrier walls 131 are arranged between the deposition source nozzle unit 120 and the patterning slit sheet 150 to force the deposition material 115 to move in a straight direction. Thus, the size of the shadow zone formed on the substrate 500 is significantly reduced.

In particular, in a conventional deposition method using an FMM, deposition is performed with the FMM in close contact with a substrate in order to prevent formation of a shadow zone on the substrate. However, when the FMM is used in close contact with the substrate, defects, such as scratched patterns that have been already formed over the substrate due to the contact between the substrate and the FMM, occur. In addition, in the conventional deposition method, the size of the mask has to be the same as the size of the substrate since the mask cannot be moved relative to the substrate. Thus, the size of the mask has to be increased as display apparatuses become larger. However, it is not easy to manufacture such a large mask.

In order to overcome this problem, in the thin film deposition assembly 100 according to an aspect of the present invention, the patterning slit sheet 150 is disposed to be separated from the substrate 500 by a predetermined distance. This may be facilitated by installing the barrier walls 131 to reduce the size of the shadow zone formed on the substrate 500.

When a patterning slit sheet is formed to be smaller than a substrate according to an aspect of the present invention and then, the patterning slit sheet is moved relative to the substrate a large mask like in the conventional deposition method using the FMM does not need to be manufactured. In addition, since the substrate and the patterning slit sheet are separated from each other by a predetermined distance, defects caused due to the contact between the substrate and the patterning slit sheet may be prevented. In addition, since it is unnecessary to use the patterning slit sheet in close contact with the substrate during a deposition process, the manufacturing speed may be improved.

Figure 14A:
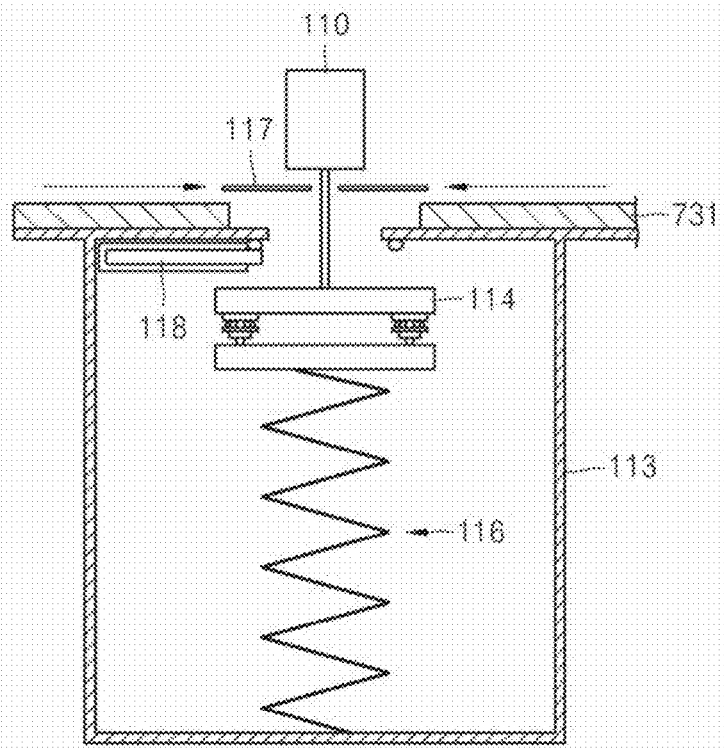
FIGS. 14A and 14B are cross-sectional views of a source chamber, according to an embodiment of the present invention.
Figure 14B:
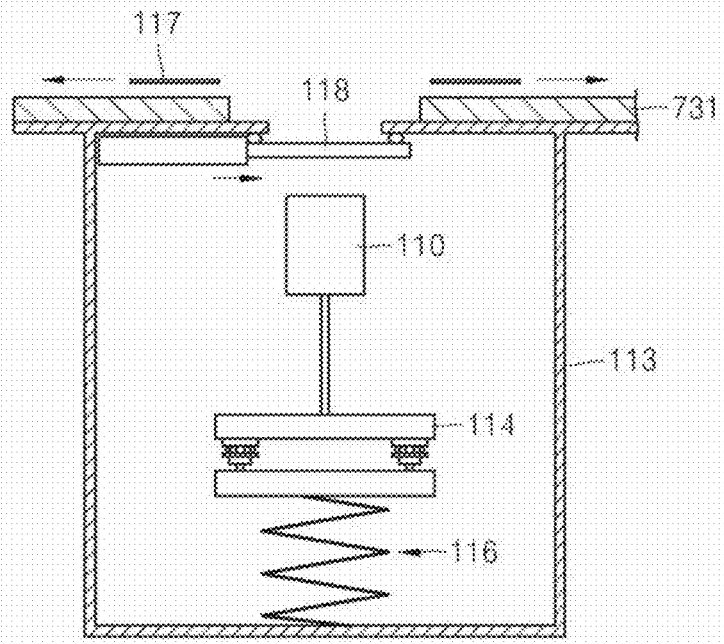

In the thin film deposition assembly 100, the deposition source 110 may be accommodated in a source chamber 113 connected to a first chamber 731 in which deposition is to be performed, as illustrated in FIGS. 14A and 14B.

In other words, the separate source chamber 113 is connected to the first chamber 731 in which deposition is to be performed, and the space between the source chamber 113 and the first chamber 731 is opened or closed by a high-vacuum valve 118.

In order to refill a deposition material in the deposition source 110 after a deposition process is completed, the first chamber 731 should be maintained under atmospheric pressure. However, when the first chamber 731 is maintained under atmospheric pressure to refill the deposition source 110, and then is maintained in a vacuum state so as to perform a new deposition process, this process takes a long time and production time increases.

To this end, in an embodiment of the present invention, a stage 114 that supports the deposition source 110 is disposed in the source chamber 113, and the stage 114 is connected to bellows 116. The stage 114 is driven as the bellows 116 is driven. Thus, the deposition source 110 can be moved between the source chamber 113 and the first chamber 731.

A shutter 117 is disposed around the deposition source 110, and when the deposition source 110 is raised into the first chamber 731, the shutter 117 blocks a connection opening to the source chamber 113 so as to prevent the source chamber 113 from being contaminated due to the deposition material, as illustrated in FIG. 14A. After the deposition process is completed, the deposition source 110 is lowered into the source chamber 113 when the shutter 117 is opened, and the source chamber 113 is closed by the high-vacuum valve 118 in an air-tight state with respect to the first chamber 731, as illustrated in FIG. 14B. In this state, the state of the source chamber 113 is changed to be under atmospheric pressure, and a separate door (not shown) disposed in the source chamber 113 is opened, so that the deposition source 110 may be taken out from the source chamber 113 to refill the deposition material in the deposition source 110. According to the structure, the deposition material may be easily filled in the deposition source 110 without exhausting the first chamber 173.

In addition, the thin film deposition assembly 100 may be mounted on the second support 614, as illustrated in FIG. 4. In this regard, a second driving unit 618 is disposed on the second support 614, and the second driving unit 618 is connected to the frame 155 of the thin film deposition assembly 100 and finely adjusts the position of the thin film deposition assembly 100 so that the substrate 500 and the thin film deposition assembly 100 may be aligned with each other. Fine adjustment of the alignment may be performed in real-time while the deposition process is being performed.

The thin film deposition assembly 100 may further include a camera assembly 170 for aligning the substrate 500 and the thin film deposition assembly 100 with each other, as illustrated in FIGS. 11 and 13. The camera assembly 170 is used to align a first mark 159 formed on the frame 155 and a second mark 501 formed on the substrate 500 with each other in real-time.

Figure 15:
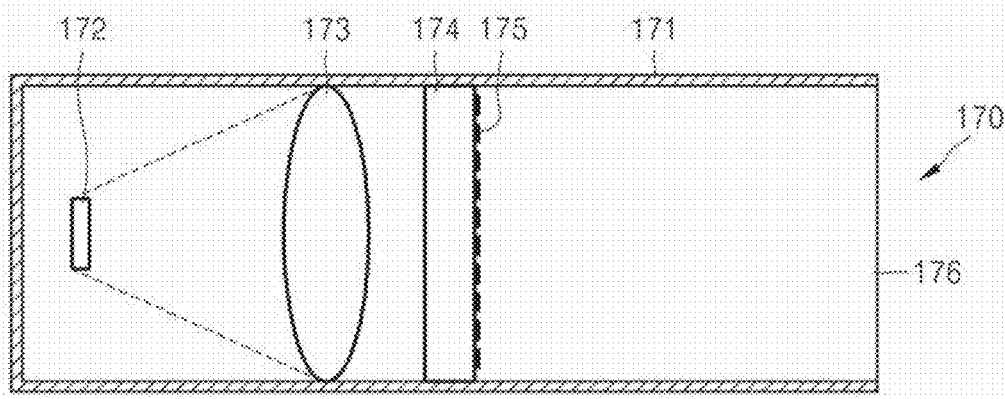
FIG. 15 is a cross-sectional view of a camera assembly, according to an embodiment of the present invention.

The camera assembly 170 may obtain a wide view area within a vacuum chamber in which the deposition process is performed, as illustrated in FIG. 10. In other words, as illustrated in FIG. 15, a camera 172 is disposed in a cylindrical hood 171, and an optical system 173 including a lens is disposed between the camera 172 and an opening 176 of the hood 171. A protection window 174 on which heating patterns 175 are formed, is disposed between the optical system 173 and the opening 176. While the deposition process is performed by using the heating patterns 175, an organic material is not deposited on the surface of the protection window 174. Thus, even when the deposition process is performed, the camera 172 can determine the alignment via the protection window 174 within the vacuum chamber.

Figure 16:
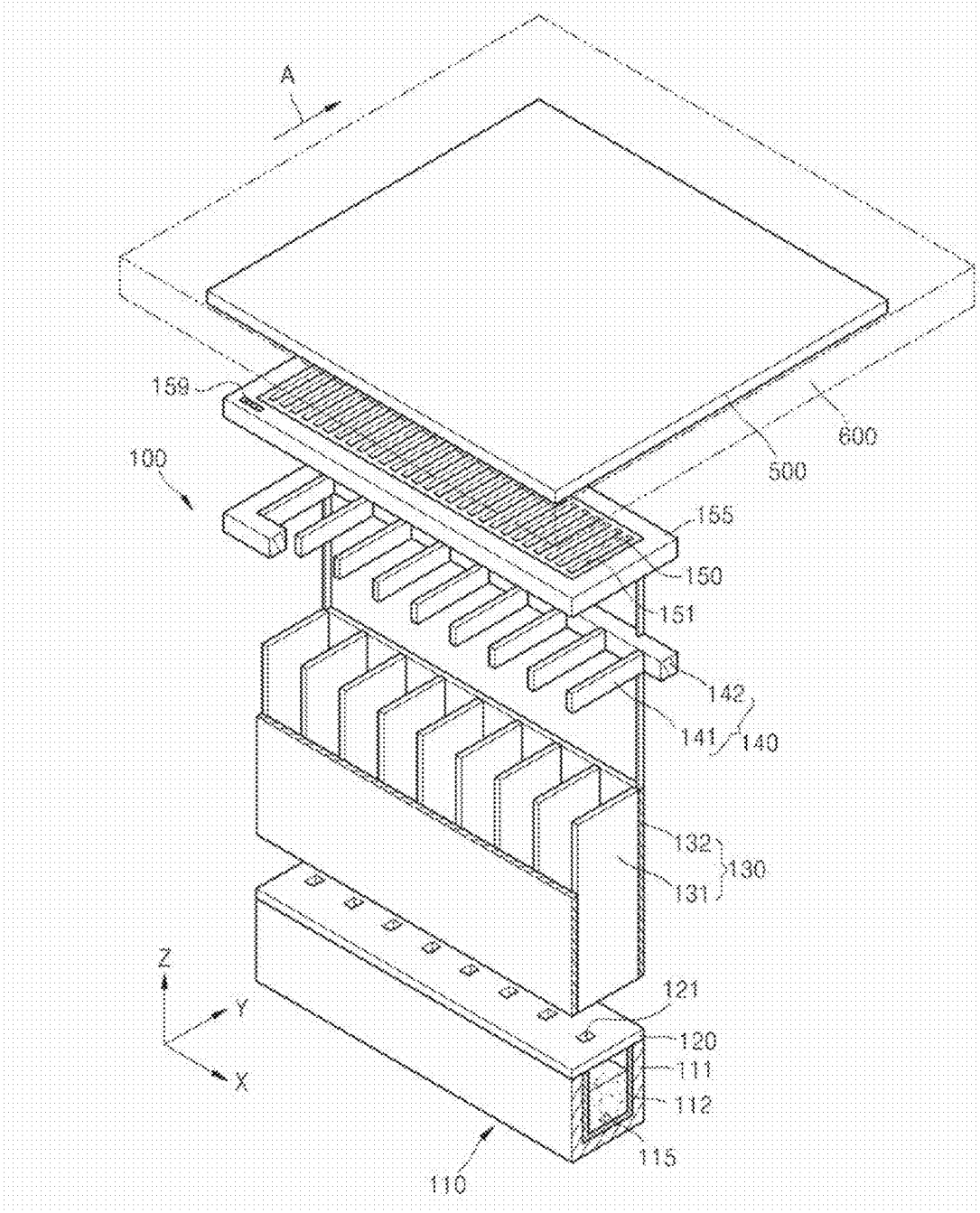
FIG. 16 is a perspective view of a thin film deposition assembly according to another embodiment of the present invention.

FIG. 16 is a schematic perspective view of a thin film deposition assembly 100 according to another embodiment of the present invention.

Referring to FIG. 16, the thin film deposition assembly 100 includes a deposition source 110, a deposition source nozzle unit 120, a first barrier wall assembly 130, a second barrier wall assembly 140, and a patterning slit sheet 150.

Although a chamber is not illustrated in FIG. 16 for convenience of explanation, all the components of the thin film deposition assembly 100 may be disposed within a chamber that has an appropriate degree of vacuum maintained therein. The chamber has an appropriate vacuum maintained therein in order to allow a deposition material to move in a substantially straight line through the thin film deposition assembly 100.

The substrate 500, which constitutes a target on which a deposition material 115 is to be deposited, is disposed in the chamber. The deposition source 110 that contains and heats the deposition material 115 is disposed in an opposite side of the chamber to the side in which the substrate 500 is disposed.

Detailed structures of the deposition source 110 and the patterning slit sheet 150 are the same as those of FIG. 11 and thus a detailed description thereof will not be provided here. The first barrier wall assembly 130 is the same as the barrier wall assembly 130 described with reference to the embodiment of FIG. 11 and thus a detailed description thereof will not be provided here.

The second barrier wall assembly 140 is disposed at a side of the first barrier wall assembly 130. The second barrier wall assembly 140 includes a plurality of second barrier walls 141, and a second barrier wall frame 142 that constitutes an outer wall of the second barrier walls 141.

The plurality of second barrier walls 141 may be arranged parallel to each other at equal intervals in the X-axis direction. In addition, each of the second barrier walls 141 may be formed to extend in the YZ plane in FIG. 16, i.e., perpendicular to the X-axis direction.

The plurality of first barrier walls 131 and second barrier walls 141 arranged as described above partition the space between the deposition source nozzle unit 120 and the patterning slit sheet 150. In the thin film deposition assembly 100 illustrated in FIG. 16, the deposition space is divided by the first barrier walls 131 and the second barrier walls 141 into sub-deposition spaces that respectively correspond to the deposition source nozzles 121 through which the deposition material 115 is discharged.

The second barrier walls 141 may be disposed to correspond respectively to the first barrier walls 131. In other words, the second barrier walls 141 may be respectively disposed to be parallel to and to be on the same plane as the first barrier walls 131. Each pair of the corresponding first and second barrier walls 131 and 141 may be located on the same plane. Although the first barrier walls 131 and the second barrier walls 141 are respectively illustrated as having the same thickness in the X-axis direction, aspects of the present invention are not limited thereto. In other words, the second barrier walls 141, which need to be accurately aligned with the patterning slit sheet 151, may be formed to be relatively thin, whereas the first barrier walls 131, which do not need to be precisely aligned with the patterning slit sheet 550, may be formed to be relatively thick. This makes it easier to manufacture the thin film deposition assembly 100.

A plurality of thin film deposition assemblies 100 as described above may be continuously arranged in the first chamber 731, as illustrated in FIG. 1. In this regard, the first through fourth thin film deposition assemblies 100, 200, 300, and 400 (see FIG. 1) may deposit different deposition materials. In this regard, patterns of patterning slits of the first through fourth thin film deposition assemblies 100, 200, 300, and 400 are different from one another, so that a layer forming process including a process of depositing red, green, and blue pixels at one time may be performed.

FIG. 17 is a cross-sectional view of an active matrix (AM) organic light-emitting display apparatus manufactured by using a thin film deposition apparatus, according to an embodiment of the present invention.

Referring to FIG. 17, the AM organic light-emitting display apparatus is disposed on a substrate 30. The substrate 30 may be formed of a transparent material, for example, glass, and may be also formed of plastic or metal. An insulating layer 31, such as a buffer layer, is formed on the substrate 30.

A thin film transistor (TFT) 40, a capacitor 50, and an organic light-emitting device 60 are formed on the insulating layer 31, as illustrated in FIG. 17.

A semiconductor active layer 41 is formed on an upper surface of the insulating layer 31 in a predetermined pattern. A gate insulating layer 32 is formed to cover the semiconductor active layer 41. The semiconductor active layer 41 may include a p-type or n-type semiconductor material.

A gate electrode 42 of the TFT 40 is formed on an upper surface of the gate insulating layer 32 corresponding to the semiconductor active layer 41. An interlayer insulating layer 33 is formed to cover the gate electrode 42. After the interlayer insulating layer 33 is formed, the gate insulating layer 32 and the interlayer insulating layer 33 are etched by, for example, performing dry etching, to form a contact hole for exposing parts of the semiconductor active layer 41.

Next, a source/drain electrode 43 is formed on the interlayer insulating layer 33 to contact the semiconductor active layer 41 through the contact hole. A passivation layer 34 is formed to cover the source/drain electrode 43, and is etched to expose a part of the source/drain electrode 43. A separate insulating layer (not shown) may be further formed on the passivation layer 34 so as to planarize the passivation layer 34.

In addition, the organic light-emitting device 60 displays predetermined image information by emitting red, green, or blue light as current flows. The organic light-emitting device 60 includes a first electrode 61 formed on the passivation layer 34. The first electrode 61 is electrically connected to the drain electrode 43 of the TFT 40.

A pixel defining layer 35 is formed to cover the first electrode 61. After an opening 64 is formed in the pixel defining layer 35, an organic emission layer 63 is formed in a region defined by the opening 64. A second electrode 62 is formed on the organic emission layer 63.

The pixel defining layer 35, which defines individual pixels, is formed of an organic material. The pixel defining layer 35 also planarizes the surface of a region of the substrate 30 where the first electrode 61 is formed, and in particular, the surface of the passivation layer 34.

The first electrode 61 and the second electrode 62 are insulated from each other, and respectively apply voltages of opposite polarities to the organic emission layer 63 to induce light emission in the organic emission layer 63.

The organic emission layer 63 may be formed of a low-molecular weight organic material or a polymer organic material. When a low-molecular weight organic material is used, the organic emission layer 63 may have a single or multi-layer structure including at least one selected from the group consisting of a hole injection layer (HIL), a hole transport layer (HTL), an emission layer (EML), an electron transport layer (ETL), an electron injection layer (EIL), etc. Examples of available organic materials may include copper phthalocyanine (CuPc), N,N'-di(naphthalene-1-yl)-N,N'-diphenyl-benzidine (NPB), tris-8-hydroxyquinoline aluminum (Alq3), etc. Such a low-molecular weight organic material may be deposited by vacuum deposition using one of the thin film deposition apparatuses or the deposition source 110 described above with reference to FIGS. 1 through 16.

First, after the opening 64 is formed in the pixel defining layer 35, the substrate 30 is conveyed into a chamber 731, as illustrated in FIG. 1. A target organic material is deposited by the first through fourth thin film deposition assemblies 100, 200, 300, and 400.

After the organic emission layer 63 is formed, the second electrode 62 may be formed by performing the same deposition process as the deposition process required to form the first electrode 61.

The first electrode 61 functions as an anode, and the second electrode 62 functions as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. Such a transparent electrode may be formed of at least one material selected from the group consisting of indium tin oxide (ITO), indium zinc oxide (IZO), zinc oxide (ZnO), and indium oxide ($In_2O_3$). Such a reflective electrode may be formed by forming a reflective layer by using at least one material selected from the group consisting of silver (Ag), magnesium (Mg), aluminum (Al), platinum (Pt), palladium (Pd), gold (Au), nickel (Ni), neodymium (Nd), iridium (Ir), chromium (Cr), and a compound thereof and by forming a layer by using at least one material selected from the group consisting of ITO, IZO, ZnO, and $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic emission layer 63 and forming an auxiliary electrode layer or a bus electrode line thereon from ITO, IZO, ZnO, $In_2O_3$, or the like. When the second electrode 62 is formed as a reflective electrode, the reflective layer may be formed by depositing at least one material selected from the group consisting of Li, Ca, LiF/Ca, LiF/Al, Al, Ag, Mg, and a compound thereof on the entire surface of the organic emission layer 63. The second electrode 62 may be formed by using the same deposition method as used to form the organic emission layer 63 described above.

The thin film deposition assemblies according to the embodiments of the present invention described above may be applied to form an organic layer or an inorganic layer of an organic TFT, and to form layers from various materials.

As described above, in a thin film deposition apparatus according to aspects of the present invention and a method of manufacturing an organic light-emitting display apparatus according to the aspects of the present invention by using the thin film deposition apparatus, the thin film deposition apparatus may be easily used to manufacture large substrates on a mass scale. In addition, the thin film deposition apparatus and the organic-light-emitting display apparatus may be easily manufactured, may improve manufacturing yield and deposition efficiency, and may allow deposition materials to be reused.

While aspects of the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display apparatus, the method comprising:

fixing a substrate that is a deposition target, on an electrostatic chuck;

conveying the electrostatic chuck on which the substrate is fixed, into a chamber that is maintained in a vacuum state by using a first circulation unit installed to pass through the chamber;

using a thin film deposition assembly disposed in the chamber and depositing an organic layer on the substrate by moving at least one of the substrate or the thin film deposition assembly relative to the other, the substrate being spaced apart from the thin film deposition assembly;

removing the substrate on which the deposition process is completed, from the chamber by using the first circulation unit;

separating the substrate on which the deposition process is completed, from the electrostatic chuck; and returning the electrostatic chuck separated from the substrate to a loading unit by using a second circulation unit installed outside the chamber, wherein the thin film deposition assembly comprises a patterning slit sheet comprising a first mark, and the substrate comprises a second mark, so that the first mark and the second mark are aligned with each other and the alignment is adjusted while the deposition process is being performed.

2. The method of claim 1, wherein a plurality of the thin film deposition assemblies are disposed in the chamber so that the deposition process is continuously performed on the substrate by using each of the thin film deposition assemblies.

3. The method of claim 1, wherein a plurality of the thin film deposition assemblies are disposed in the chamber, and the chamber comprises a first chamber and a second chamber connected to each other so that the deposition process is continuously performed on the substrate while the substrate is moved relative to the thin film deposition assembly in the first and second chambers.

4. The method of claim 1, wherein the thin film deposition assembly comprises:
   a deposition source that discharges a deposition material; and
   a deposition source nozzle unit that is disposed at a side of the deposition source and comprises a plurality of deposition source nozzles arranged in a first direction,
   wherein the patterning slit sheet is disposed opposite to the deposition source nozzle unit and comprises a plurality of patterning slits arranged in a second direction that is perpendicular to the first direction, the patterning slit sheet being smaller than the substrate in at least one of the first direction or the second direction,
   wherein the deposition source, the deposition source nozzle unit, and the patterning slit sheet are integrally formed as one body, and
   wherein the deposition process is performed on the substrate while the substrate is moved relative to the thin film deposition assembly in the first direction.

5. The method of claim 4, wherein the thin film deposition assembly comprises a camera assembly to capture a degree of alignment of the first mark and the second mark,
   wherein the camera assembly comprises:
      a hood having an opening formed in one end of the hood;
      a camera installed in the hood;
      an optical system disposed between the camera and the opening;
      a protection window disposed between the optical system and the opening; and
      a heater disposed on the protection window, and
   wherein the degree of alignment of the first mark and the second mark is detected while the deposition process is performed.

6. The method of claim 4, wherein a thin film deposition apparatus comprises:
   a source chamber which is connected to the chamber and in which the deposition source of the thin film deposition assembly is accommodated;
   a valve opening or closing a space between the chamber and the source chamber; and
   a shutter closing the space between the chamber and the source chamber when the deposition source is located in the chamber, and
   the method further comprising:
   conveying the deposition source to the source chamber after the deposition process on the substrate is completed;
   closing the space between the chamber and the source chamber by using the valve; and
   replacing the deposition source.

7. The method of claim 1, wherein the thin film deposition assembly comprises:
   a deposition source that discharges a deposition material;
   a deposition source nozzle unit that is disposed at a side of the deposition source and comprises a plurality of deposition source nozzles arranged in a first direction;
   the patterning slit sheet that is disposed opposite to the deposition source nozzle unit and comprises a plurality of patterning slits arranged in the first direction, the patterning slit sheet being smaller than the substrate in at least one of the first direction or a second direction perpendicular to the first direction; and
   a barrier wall assembly that is disposed between the deposition source nozzle unit and the patterning slit sheet in the first direction, and comprises a plurality of barrier walls that partition a space between the deposition source nozzle unit and the patterning slit sheet into a plurality of sub-deposition spaces,
   wherein the deposition process is performed on the substrate while the thin film deposition assembly or the substrate is moved relative to the other.

8. The method of claim 7, wherein the thin film deposition assembly comprises a camera assembly to capture a degree of alignment of the first mark and the second mark, and
   wherein the camera assembly comprises:
      a hood having an opening formed in one end of the hood;
      a camera installed in the hood;
      an optical system disposed between the camera and the opening;
      a protection window disposed between the optical system and the opening; and
      a heater disposed on the protection window, and
   wherein the degree of alignment of the first mark and the second mark is detected while the deposition process is performed.

9. The method of claim 7, wherein a thin film deposition apparatus comprises:
   a source chamber which is connected to the chamber and in which the deposition source of the thin film deposition assembly is accommodated;
   a valve opening or closing a space between the chamber and the source chamber; and
   a shutter closing the space between the chamber and the source chamber when the deposition source is located at the chamber, and
   the method further comprising:
   conveying the deposition source to the source chamber after the deposition process on the substrate is completed;
   closing the space between the chamber and the source chamber by using the valve; and
   replacing the deposition source.

* * * * *